Figure 1:
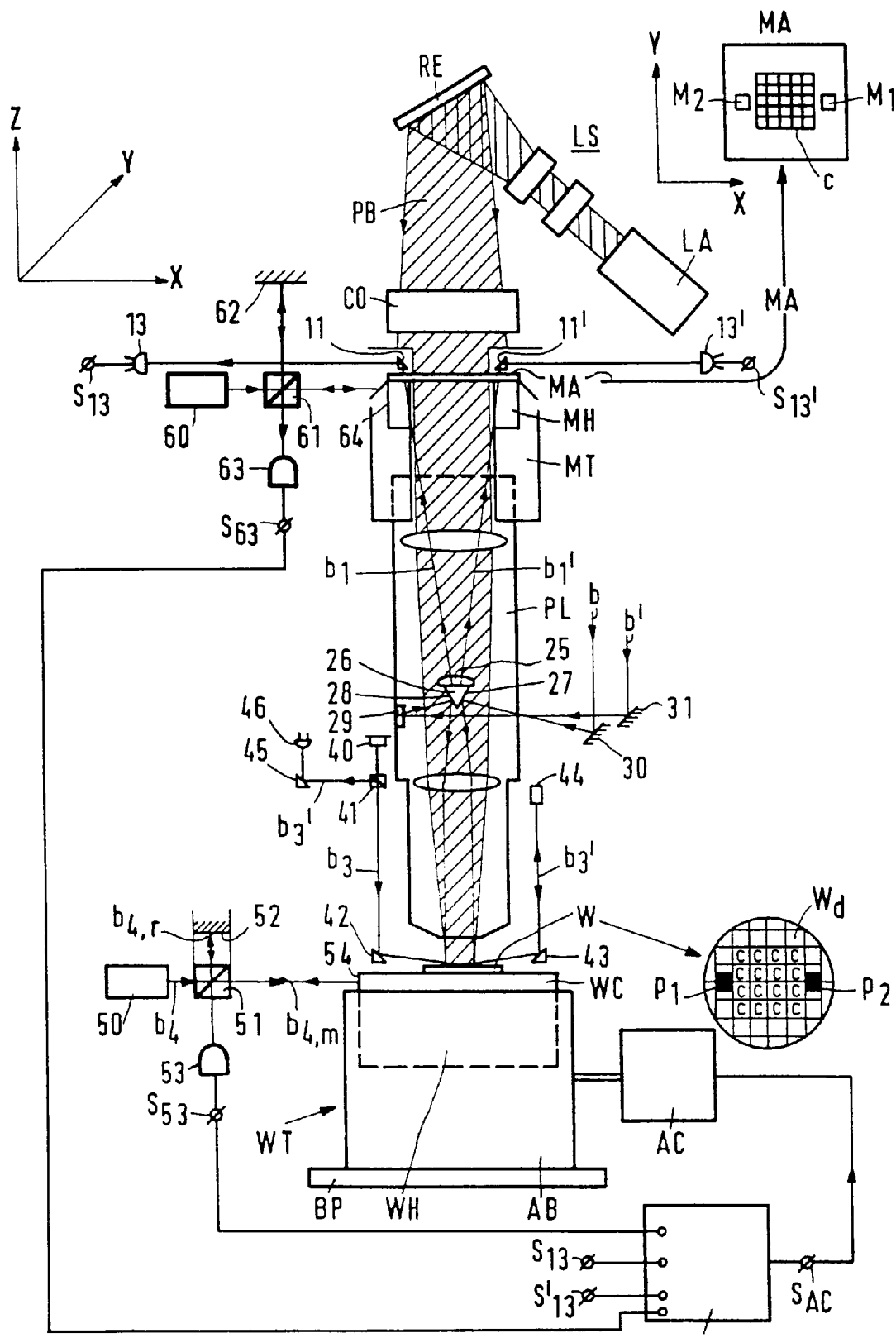

United States Patent

Van Den Brink et al.

[11] Patent Number: 6,084,673
[45] Date of Patent: Jul. 4, 2000

[54] LITHOGRAPHIC APPARATUS FOR STEP-AND-SCAN IMAGING OF MASK PATTERN WITH INTERFEROMETER MIRRORS ON THE MASK AND WAFER HOLDERS

[75] Inventors: Marinus A. Van Den Brink; Alexander Straaijer, both of Eindhoven, Netherlands

[73] Assignee: ASM Lithography B.V., Veldhoven, Netherlands

[21] Appl. No.: 08/810,793

[22] Filed: Mar. 4, 1997

[30] Foreign Application Priority Data

Mar. 4, 1996 [EP] European Pat. Off. .............. 96200575

[51] Int. Cl.[7] ....................................................... G01B 9/02
[52] U.S. Cl. ........................... 356/358; 356/363; 356/351
[58] Field of Search ..................... 356/349, 351, 356/358, 363, 401; 250/548; 33/1 M; 355/53

[56] References Cited

U.S. PATENT DOCUMENTS

| | | | |
|---|---|---|---|
| 4,251,160 | 2/1981 | Bouwhuis et al. . | |
| 4,356,392 | 10/1982 | Wittekoek et al. . | |
| 4,737,283 | 4/1988 | Gresch . | |
| 4,765,741 | 8/1988 | Detro et al. ............................. | 356/358 |
| 4,778,275 | 10/1988 | Van Den Brink et al. ............. | 356/401 |
| 5,064,289 | 11/1991 | Bockman ................................ | 356/358 |
| 5,114,234 | 5/1992 | Otsuka et al. .......................... | 356/358 |
| 5,151,749 | 9/1992 | Tanimoto et al. ...................... | 356/358 |
| 5,191,200 | 3/1993 | Van Der Werf et al. ............. | 250/201.4 |
| 5,194,893 | 3/1993 | Nishi ........................................ | 355/53 |
| 5,633,720 | 5/1997 | Takahashi ............................... | 256/401 |
| 5,801,832 | 9/1998 | Van Den Brink ...................... | 356/358 |

FOREIGN PATENT DOCUMENTS

| | | |
|---|---|---|
| 467 445 | 1/1992 | European Pat. Off. . |
| 498 499 | 12/1992 | European Pat. Off. . |

OTHER PUBLICATIONS

SPIE, vol. 1088: Optical/Laser Microlithography, pp. 268–272.

*Primary Examiner*—Samuel A. Turner
*Attorney, Agent, or Firm*—Pillsbury Madison & Sutro LLP

[57] ABSTRACT

A lithographic projection apparatus for step-and-scan imaging of a mask pattern (c) on a substrate (W) is described. The synchronous movement of the mast (MA) and the substrate (W) during scanning is controlled by means of contactless measuring systems, inter alia, interferometer systems (ISR, ISW), while the measuring faces ($R_{1,r}$, $R_{1,w}$) associated with these systems are formed by faces of the holders (WH, MH) for the substrate (W) and the mask (MA), so that very accurate measurements are possible.

15 Claims, 11 Drawing Sheets

LITHOGRAPHIC APPARATUS FOR STEP-AND-SCAN IMAGING OF MASK PATTERN WITH INTERFEROMETER MIRRORS ON THE MASK AND WAFER HOLDERS

The invention relates to a lithographic projection apparatus for step-and-scan imaging of a mask pattern, present in a mask, each time on a different area of a substrate provided with a radiation-sensitive layer, said apparatus, viewed in the direction of a projection beam, successively comprising:

a radiation system for supplying a projection beam whose cross-section in the plane of the mask is smaller than the mask pattern, a mask table being movable in at least a first direction, the scan direction, and provided with a mask holder in which the mask can be fixed, a projection system for imaging the irradiated part of the mask pattern on the substrate with a magnification M, and a substrate table which is movable in the first direction and in a second direction perpendicular thereto and is provided with a substrate holder in which the substrate can be fixed, further comprising:

mask table drive means for moving the mask table during each imaging operation in at least the scan direction with respect to the projection beam and the projection system, substrate table drive means for moving the substrate table during each imaging operation in at least the scan direction at a rate equal to M times the rate at which the mask is moved, and a first and a second interferometer system for continuously measuring, during each imaging operation, the mutual position of the mask and the substrate.

The apparatus may be a photolithographic apparatus in which the projection beam is a beam of electromagnetic radiation, such as deep UV radiation, and in which the projection system is an optical projection lens system. It may alternatively be an apparatus in which the projection radiation is a charged-particle radiation, such as electron radiation, ion radiation, or X-ray radiation, and in which an associated projection system, for example, an electron lens system is used. A photolithographic apparatus of the construction described above and being usable, inter alia, in the manufacture of integrated circuits, or ICs, is known from, inter alia, U.S. Pat. No. 5,194,893.

Due to the demand for an increasingly large number of electronic components in one IC, increasingly smaller details, also referred to as line widths, must be imaged by means of the projection apparatus in each area of the substrate on which an IC must be formed, which area is also referred to as IC area or "die". One also wants to enlarge these IC areas so as to increase the number of components per IC in that way as well. For the projection lens system this means, on the one hand, that the resolving power, hence its numerical aperture, must be raised and, on the other hand, the image field must be enlarged.

Hitherto, one has been able, be it with great effort and at high costs, to find an optimum between the two technologically contradictory requirements for a projection lens system. For a step-projection apparatus, known as wafer stepper, a projection lens system having a numerical aperture of approximately 0.6 and an image field of 22 mm² has been made for the manufacture of ICs of the 64 Mbit type. With this projection lens system, line widths of 0.35 µm can be imaged on the substrate. This approaches approximately the limits of a projection lens system which is still easy to handle and manufacturable. If even smaller details are to be imaged, hence even smaller line widths are to be formed on the substrate, in other words, if an even larger numerical aperture is to be given to the projection lens system, then this will only be at the expense of the image field size.

This dilemma can be circumvented by changing from a step-projection apparatus to a step-and-scan apparatus as described in U.S. Pat. No. 5,194,893. In a step-projection apparatus, the complete mask pattern is illuminated and imaged as a whole on an IC area on the substrate. Subsequently, a step is made, i.e. the substrate is moved with respect to the projection lens system and the mask pattern, until a second IC area is present opposite the mask pattern and within the image field of the projection lens system, and a second image of the mask pattern is formed in that area. Subsequently, the apparatus steps to a third IC area and the mask pattern is imaged again, and so forth, until images of the mask pattern have been formed in all IC areas. In a step-and-scan apparatus, the same stepping movements are performed, but each time only a small part of the mask pattern is imaged on a corresponding sub-area of the IC area. By imaging successive parts of the mask pattern on successive sub-areas of the IC area, an image of the complete mask pattern is obtained on an IC area. To this end, the mask pattern is illuminated with a projection beam which forms a small, for example, rectangular or arcuate illumination spot at the location of the mask pattern, and the mask table and the substrate table are moved in the same direction or in the opposite direction, the scan direction, with respect to the projection lens system and the projection beam, while the rate of the substrate table is M times that of the mask table. M is the magnification with which the mask pattern is imaged. A commonly used value for M is +¼ or −¼ for tables moving in the same direction or the opposite direction, respectively. Other values of M, for example 1, are alternatively possible. Said movement of the mask table and the substrate table with respect to the illumination spot is referred to as the scan movement. The illumination spot has its largest dimension in the direction transverse to the scan direction. This dimension may be equal to the width of the mask pattern, so that this pattern is imaged in one scan movement. However, it is alternatively possible that said dimension is half the mask pattern width or even smaller. In that case, the complete mask pattern is imaged by performing two, or a larger number of, opposed scan movements. It should then be ensured that the mask and the substrate have the correct mutual position at any moment, which can be realized by means of a very accurate synchronization of the movements of the mask and the substrate, i.e. the rate $V_{sub}$ of the substrate should always be equal to M times the rate $V_{ma}$ of the mask.

As compared with a step-projection apparatus, in which an accurate alignment of the mask pattern with respect to the IC areas on the substrate, an accurate focusing of the projection lens system on the substrate and an accurate check of the stepping substrate table must take place, it should also be measured in a step-and-scan projection apparatus whether condition $V_{sub}=MV_{ma}$ is fulfilled, hence whether the substrate and the mask pattern image are, as it were, stationary with respect to each other. With reference to this measurement, the speed of one of the tables can then be adapted to that of the other.

In the projection apparatus described in U.S. Pat. No. 5,194,893, two interferometer systems are used for checking the condition $V_{sub}=MV_{ma}$. The measuring mirror of the first interferometer system is secured to the substrate table, so that the displacement of the substrate table in the scan direction, hereinafter also referred to as X direction, can be measured with this system, as well as what is referred to as the yaw, i.e. the rotation of the substrate about the axis of the projection lens system, hereinafter also referred to as Z axis. The measuring mirror of the second interferometer system is secured to the mask table, so that the displacement of this table in the scan direction and the yaw of this table can be measured by means of this system. The output signals of the two interferometer systems are applied to an electronic processing unit, for example, a microcomputer in which the signals are subtracted from each other and processed to control signals for, inter alia, actuators for the tables. In the known apparatus, the reference mirrors, i.e. the stationary mirrors, of the two interferometer systems are secured to the projection lens holder. In this way, the movements in the scan direction of the two tables with respect to the projection lens holder and hence with respect to each other can be measured.

If the interferometer measurements are to be reliable, a number of conditions should be fulfilled, which cannot, or cannot easily be fulfilled in practice. One of the most important conditions is that the movements, in the scan direction, of the measuring mirrors should be very accurately equal to those of the substrate and the mask, respectively. For example, actuators for adjusting the substrate in the Z direction are provided in the substrate table, and by energizing these actuators, the position of the substrate can also be changed in the X direction without the position of the measuring mirror changing in the same way. Since only the positions in the X direction and the rotation about the Z axis of the mask and the substrate are measured in the apparatus described in U.S. Pat. No. 5,194,893, very strict requirements must be imposed on the guidance of the mask and the substrate so that a displacement in the Y direction or a tilt about the Y axis, which may affect the measurement of the X position, cannot occur. In a step-and-scan apparatus with which detail sizes, or line widths of 0.35 µm must be imaged on the substrate, it is substantially impossible to comply with the requirements of journaling. Moreover, it should be possible to illuminate the mask with an illumination spot whose dimension in the Y direction is smaller than the width of the mask pattern, in order that an even smaller image field is sufficient and the resolving power can thus be further increased. Then, also the positions/movements of the mask and the substrate in the Y direction should be measured when the mask pattern is imaged on an IC area of the substrate.

The present invention provides a novel measuring concept for a step-and-scan projection apparatus with which the above-mentioned requirement can be met and in which the above-mentioned problems can be prevented. This novel concept comprises a number of aspects which can be used separately or in combination.

In accordance with a first aspect of the invention, the projection apparatus is characterized in that the measuring mirrors of the interferometer systems are constituted by reflecting side faces of the mask holder and the substrate holder, respectively.

Reflecting side faces are understood to mean that these side faces themselves are reflecting or that reflectors are rigidly secured to these side faces.

Since the measuring mirrors are rigidly secured to the substrate and the mask, the movements of these elements themselves are measured directly and hence reliably, including the movements, left outside consideration in the known apparatus, resulting from mutual displacements of elements of the substrate table and from mutual displacements of elements of the mask table. A reference mirror does not have to be arranged on the projection lens in this apparatus.

In accordance with a further aspect of the present invention, the projection apparatus is further characterized in that the substrate interferometer system is a five-axis system, and in that the mask interferometer system comprises at least three measuring axes.

The five-axis interferometer system cooperates with a first mirror, which is perpendicular to the X direction, and a second mirror, which is perpendicular to the Y direction, and comprises, for example five measuring axes terminating at five different points of these mirrors, and five detectors. The output signals of these detectors can be combined to:

an X position signal an Y position signal a signal $\phi_x$ indicating the tilt about the X axis a signal $\phi_y$ indicating the tilt about the Y axis, and a signal $\phi_z$ indicating the rotation about the Z axis.

By using a five-axis interferometer system and servosystems driven thereby, it is not necessary to impose strict requirements on the guidance of the element, in this case the substrate, which is controlled by the interferometer system. The accuracy with which this element can be displaced and positioned is now determined by the measuring accuracy of the interferometer system, which accuracy is known to be very great.

The three-axis mask interferometer system cooperates with a first mirror perpendicular to the X direction and a second mirror perpendicular to the Y direction and comprises three measuring axes and three detectors. The X and Y positions of the mask and the rotation $\phi_z$ of the mask about the Z axis can be measured with this system.

It is further noted that it is known per se from European Patent Application No. 0 498 499 in the name of the Applicant to use a five-axis substrate interferometer system in a projection apparatus, which system cooperates with two mirrors extending perpendicularly to the X direction and the Y direction, respectively. However, this apparatus is a step-projection apparatus in which the mask is stationary when a complete substrate is being illuminated. In this apparatus, no mask interferometer system is used and the substrate interferometer is only used for positioning and controlled movement of the substrate table.

Alternatively, the projection apparatus may be characterized in that the substrate interferometer system is a three-axis system, in that contactless sensors are provided for measuring substrate movements not measured by the three-axis interferometer system, in that the substrate holder is provided with measuring faces for the contactless sensors, and in that the mask interferometer system comprises at least three measuring axes.

Again, all measuring faces of the measuring systems, with which the movements of the mask and the substrate are controlled, are rigid components of the holders in which the substrate and the mask are rigidly secured, so that the measurements of these movements are very reliable.

A first embodiment of the projection apparatus is further characterized in that contactless sensors are provided for measuring mask movements not measured by the three-axis interferometer system, and in that the mask holder is provided with measuring faces associated with said sensors.

This embodiment is particularly used if the mask pattern is scanned in one direction only and this mask pattern is thus moved only in this direction along a relatively large distance when said mask pattern is being projected. Since the mask movements possibly occurring in other directions are then small, other contactless sensors capable of measuring only small movements with a sufficiently great accuracy, but being less costly than interferometer systems, can be used for measuring these movements.

A contactless sensor may be constituted by a capacitive sensor which cooperates with a guiding, for example metal, surface part, or measuring face, of the mask holder. Such a sensor may alternatively be constituted by an optical measuring head, for example in the form of an optical scanning head as used in the known CD players.

However, an alternative embodiment of the projection apparatus is further characterized in that the mask interferometer system is a five-axis system.

In this embodiment, the movements of the mask are measured in the same manner and with the same accuracy as that of the substrate coupled to a five-axis interferometer system. This embodiment is particularly used when the mask pattern is also moved in a second direction perpendicular to the scan direction so as to be able to scan the mask pattern in two or more movements, each time in opposite directions.

In principle, the projection apparatus according to the invention is suitable for forming mask pattern images on the substrate with detail dimensions, or line widths, of the order of 0.18 $\mu$m, so that this apparatus is suitable for the production of 1 Gbit ICs. However, to this end, a measuring accuracy of the order of 5 nm should be achievable. In the chosen measuring concept of two separate multi-axis interferometer systems for the mask and the substrate, and electronically processing the electric output signals of these interferometer systems to the desired measuring signals, the delay time elapsing between the instant when a measurement is performed and the instant when the desired measuring result is available is going to play an important role. This delay time is dependent on the processing rate of the interferometer system electronics and the measuring and control computer. If the rate at which the substrate is scanned is, for example 250 mm/sec and the required measuring accuracy is, for example 2 nm, then the maximally admissible, variable delay time is, for example 12.5 nsec. Thanks to the high processing rate and the stability of modern interferometer systems, this requirement can be satisfied.

The projection apparatus is preferably further characterized in that, with the exception of the measuring mirrors, the components of the interferometer systems and the possible further sensors are arranged in one rigid frame in which also the projection lens system is rigidly secured, this frame being suspended in a dynamically isolated way from the other components of the apparatus.

This measure considerably contributes to the realization of the desired measuring accuracy.

The interferometers are now free from disturbance and are rigidly coupled to the projection lens. Since said frame, also referred to as metrology frame, is suspended in a dynamically isolated way, or free from vibrations, in the apparatus, the positions of the interferometers present in this apparatus are no longer affected by external forces, such as the drive forces for the substrate table and the mask table.

As described in European Patent Application No. 0 498 499, it is possible, after a global alignment of the substrate with respect to the mask, and if the substrate interferometer system is a five-axis system, to position the separate IC areas on the substrate sufficiently accurately with respect to the mask pattern without having to align each IC area again, which yields a considerable gain of time and greater accuracy. The extra measuring signals in the form of tilt-measuring signals supplied by a five-axis interferometer system are used in different embodiments of the projection apparatus and in different manners.

A first embodiment of the projection apparatus, having a local leveling facility, is characterized in that the chief rays of the measuring beams of the substrate interferometer system are not located in the plane of the substrate, and in that a substrate measuring signal processing unit is provided for converting all substrate measuring signals into control signals for the X-Y and $\phi_z$ drives for the substrate.

In this embodiment, the tilt measuring signals are used to correct the X and Y axis displacement measuring signals and the rotation measuring signal for the tilts of the substrate due to the local leveling of the substrate. The local leveling is understood to mean the separate leveling of each IC area.

An embodiment of the apparatus, in which no local leveling takes place, is further characterized in that a substrate measuring signal processing unit is provided for converting the substrate measuring signals into control signals for the X, Y and $\phi_z$ substrate drives, and into control signals for actuators eliminating tilts of the substrate.

The substrate can then be very accurately manoeuvred at the desired X and Y positions without the displacement from a first position to a subsequent position resulting in a tilt about the X or Y axis.

In principle, the mask does not have to be tilted or locally leveled. However, it is possible to do this. If the mask interferometer system is implemented as a five-axis system, the above-mentioned possibilities for the substrate interferometer system could also be realized for the mask interferometer system.

To prevent measuring errors from occurring due to changes in ambient parameters, such as pressure, temperature, humidity and air composition, resulting in a change of the refractive index of the interferometer medium and the apparent wavelength of the interferometer beams, said interferometer system may be further characterized in that the system further has a reference axis whose measuring beam cooperates with a stationary reflector.

As described in European Patent Application No. 0 498 499, the variation of the refractive index of the medium can be measured by means of this extra measuring beam which, similarly as the other interferometer beams is traveling in the same medium.

The measuring signal generated by means of the extra measuring beam is applied to the signal processing unit, so that the results of the X, Y, and $\psi$x, $\psi$y and $\psi$z measurements can be corrected for changes of the refractive index.

To enhance the measuring accuracy, the projection apparatus according to the invention may be further characterized in that means are provided for supplying a stream of air having a constant refractive index at the area of spaces in which the interferometer beams propagate.

These means may consist of, for example a first air shower at the area of the substrate and a second air shower at the area of the mask. As described in European Patent Application No. 0 498 499, not only the optical quality of the interferometer medium is enhanced by said stream of air, but it is also achieved that the medium has the same quality at the location of all measuring beams, including the possible reference-axis beam. The air which is blown in is preferably air having a very high degree of purity and a very constant temperature.

The projection apparatus may further have the constructive characteristic features as claimed in any one of claims 11 to 17.

These and other aspects of the invention will be apparent from and elucidated with reference to the embodiments described hereinafter.

IN THE DRAWINGS

Figure 2:
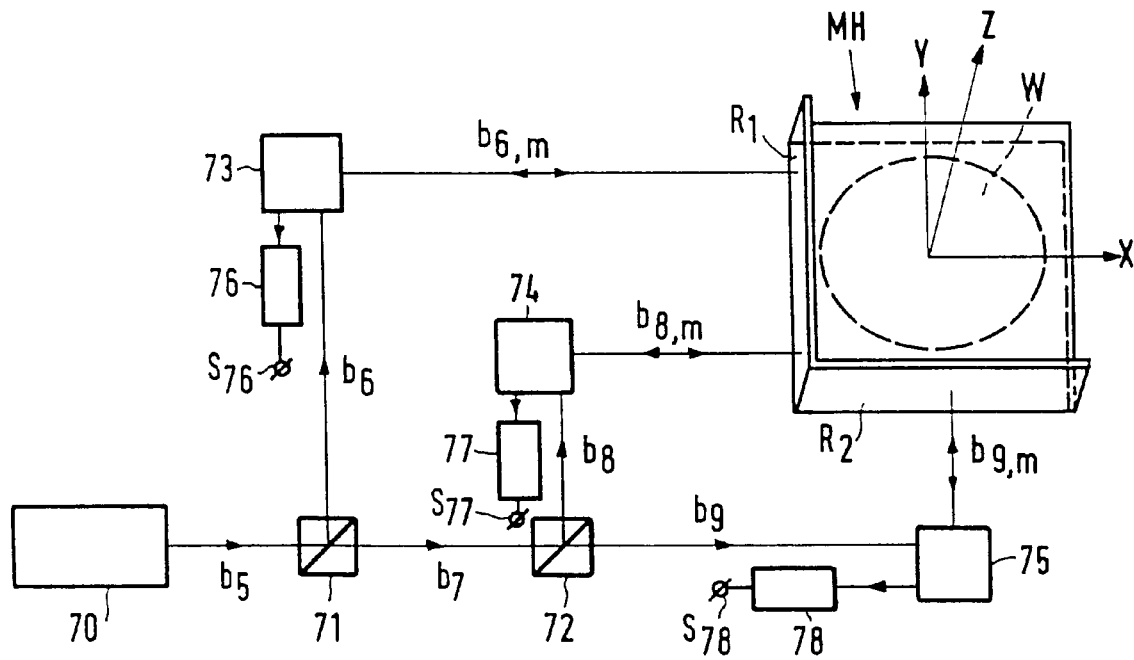
Figure 3:
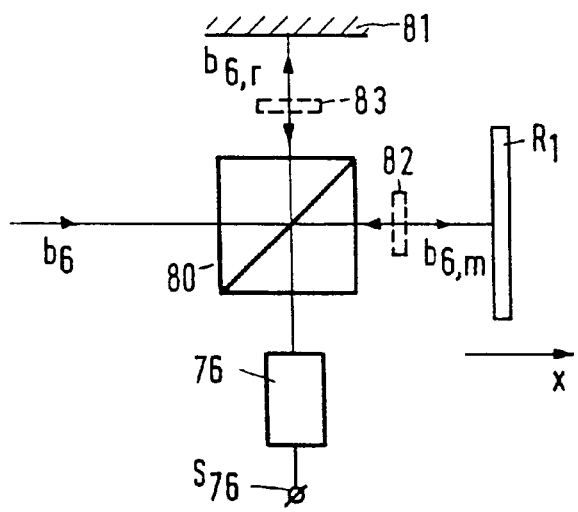
Figure 4:
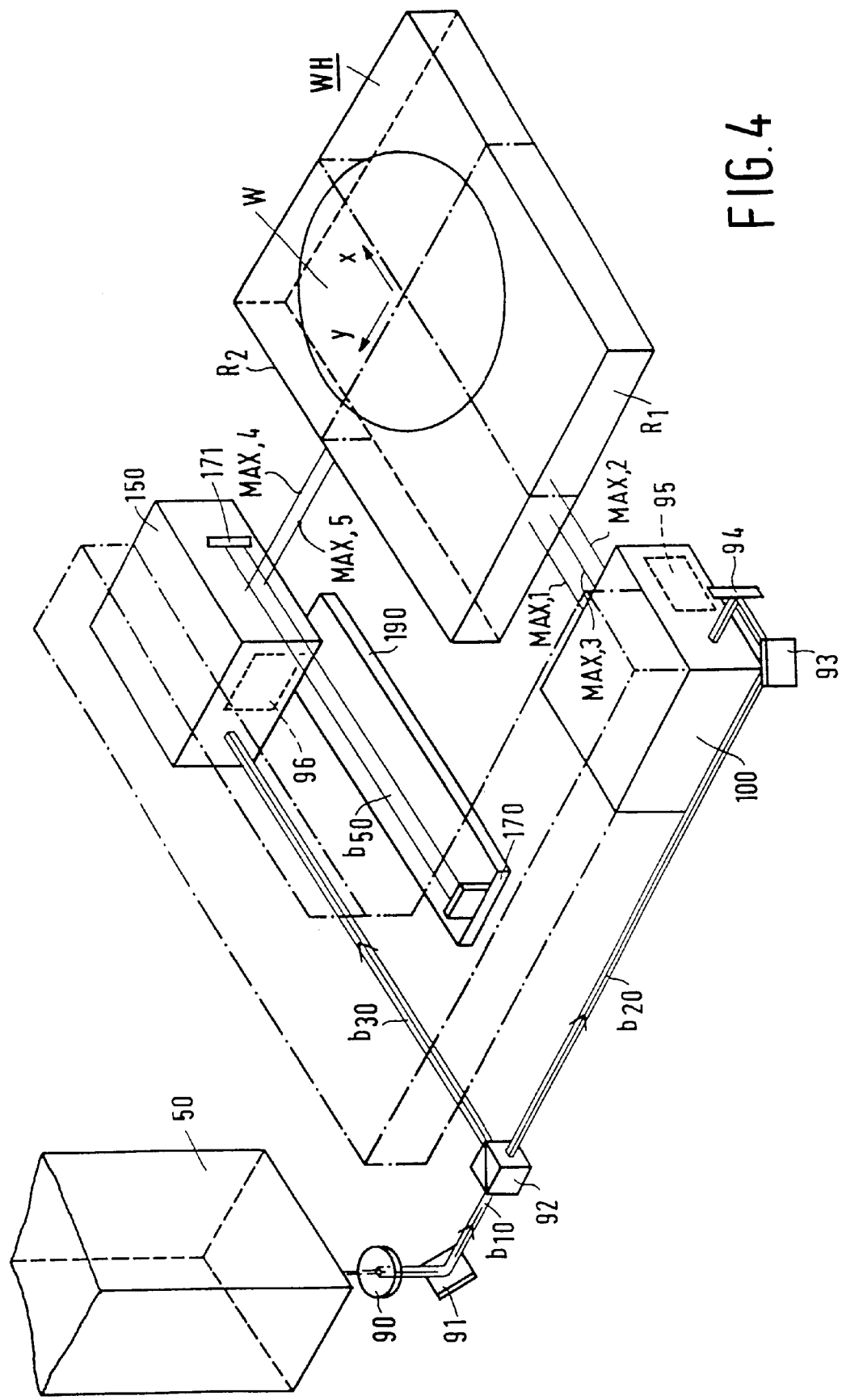
Figure 5:
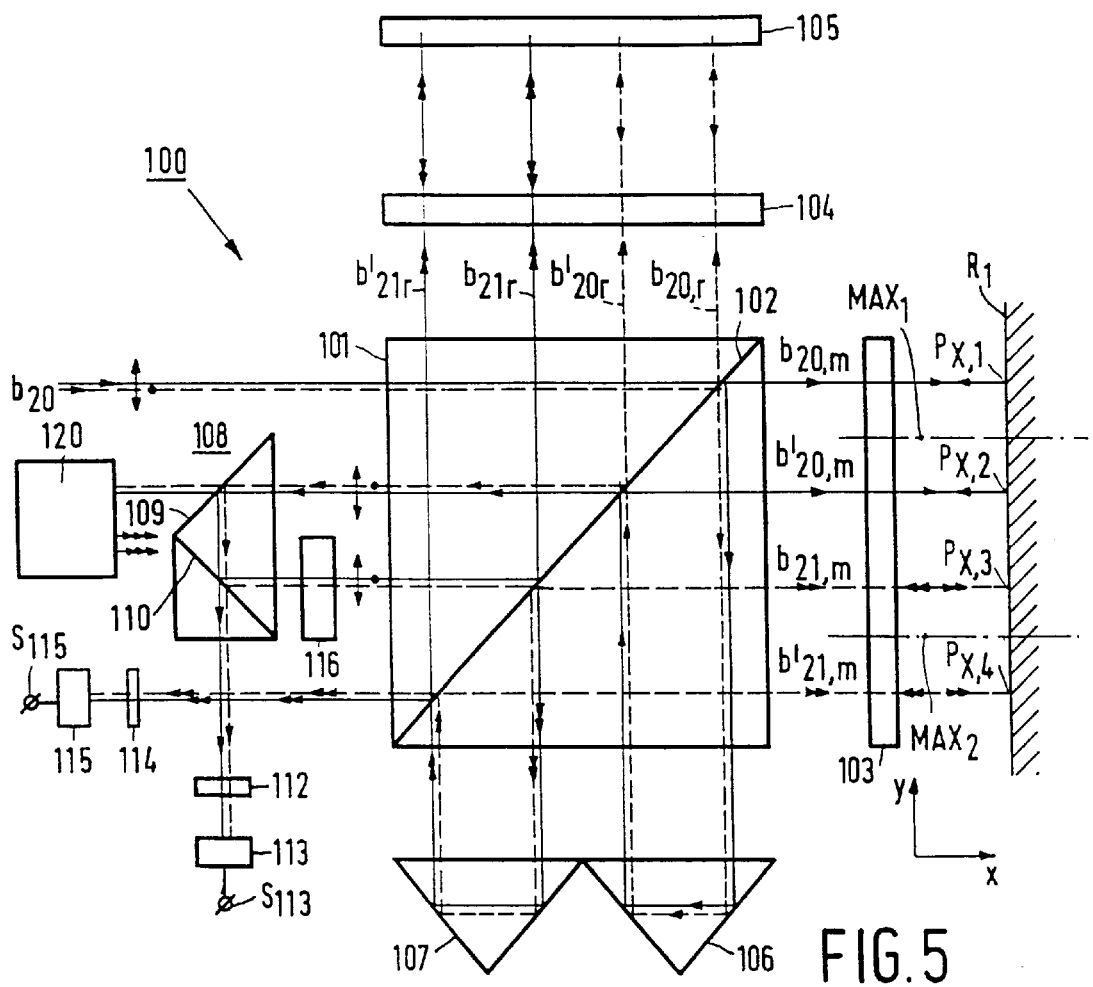
Figure 7:
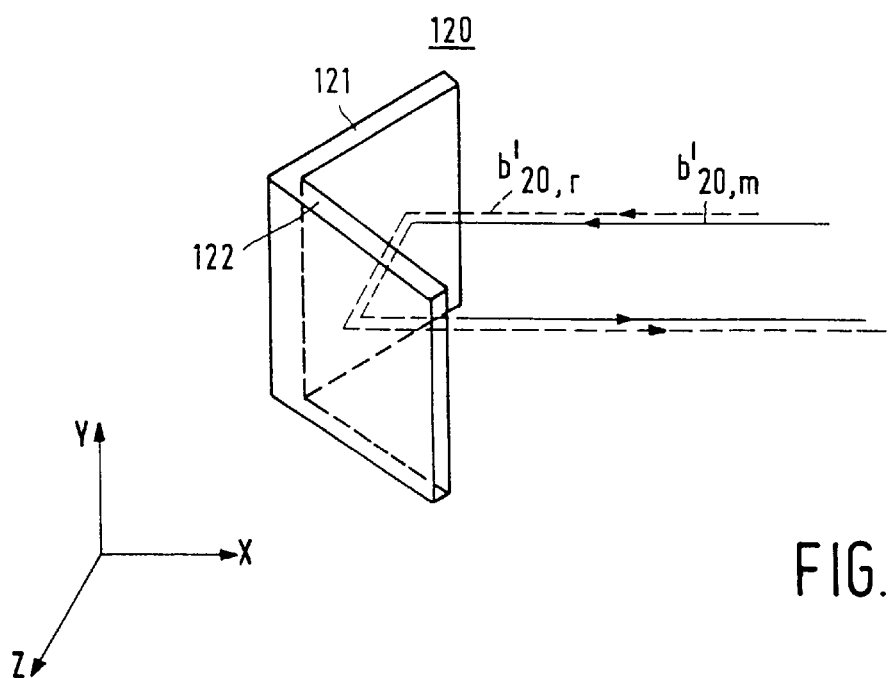
Figure 6:
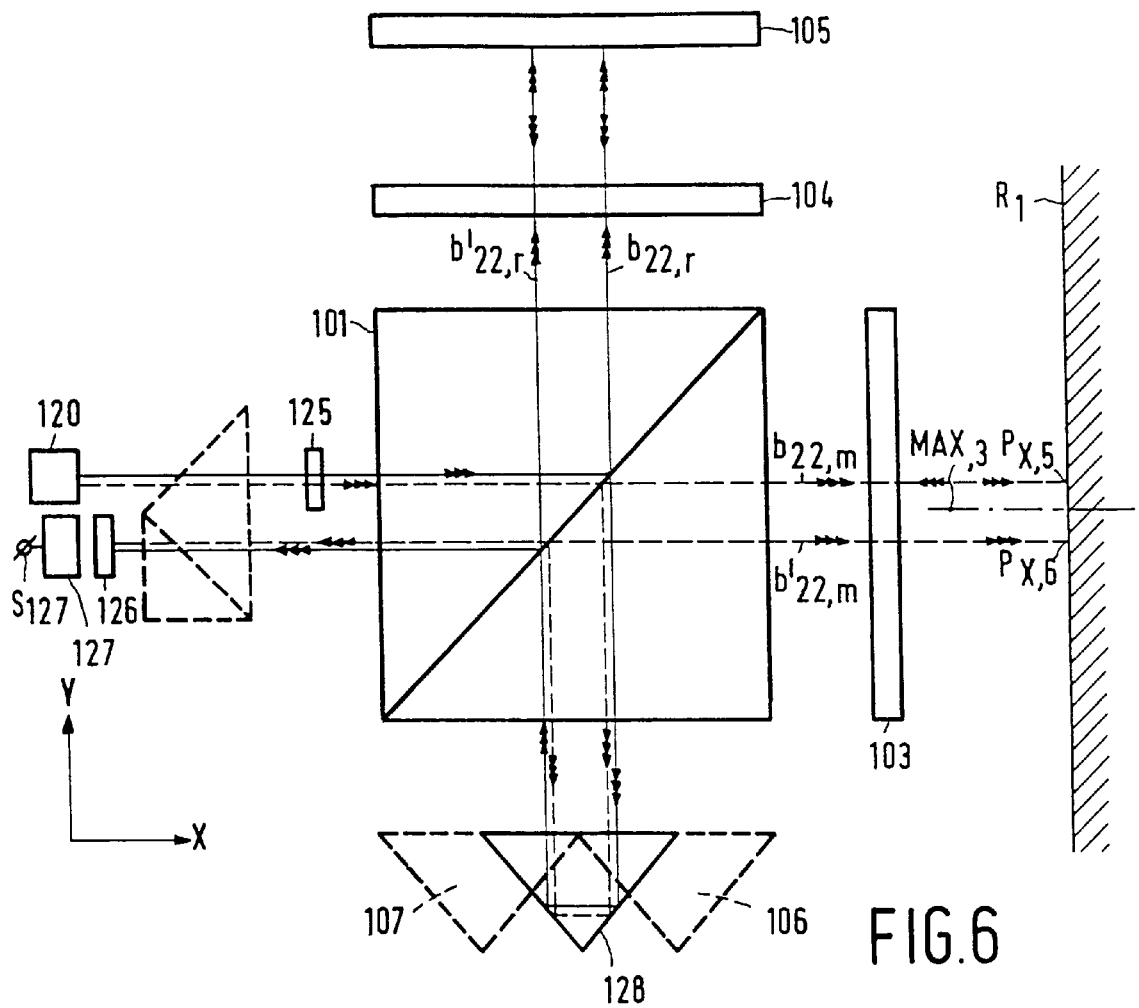
Figure 8:
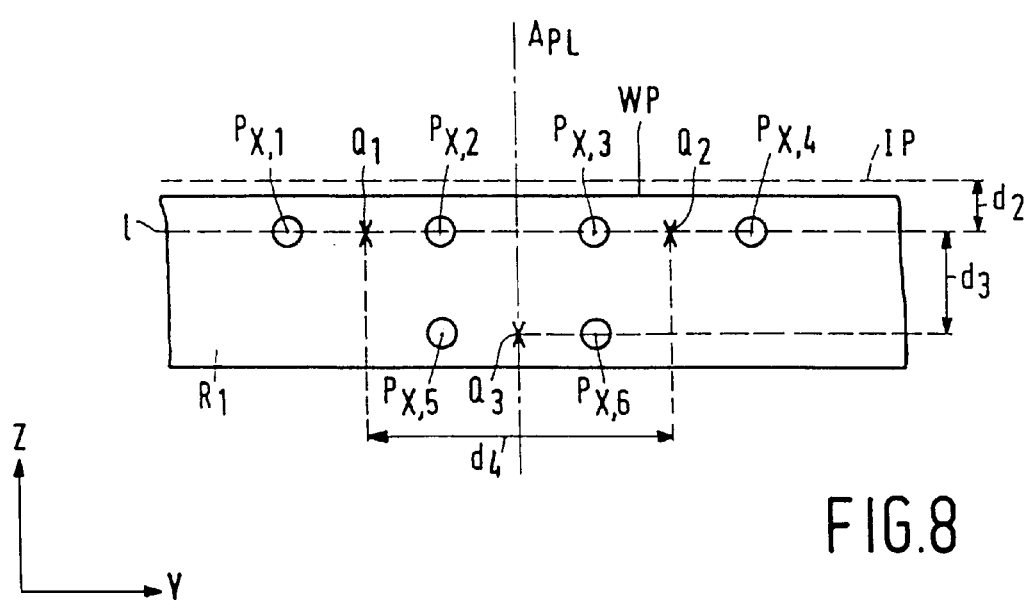
Figure 9:
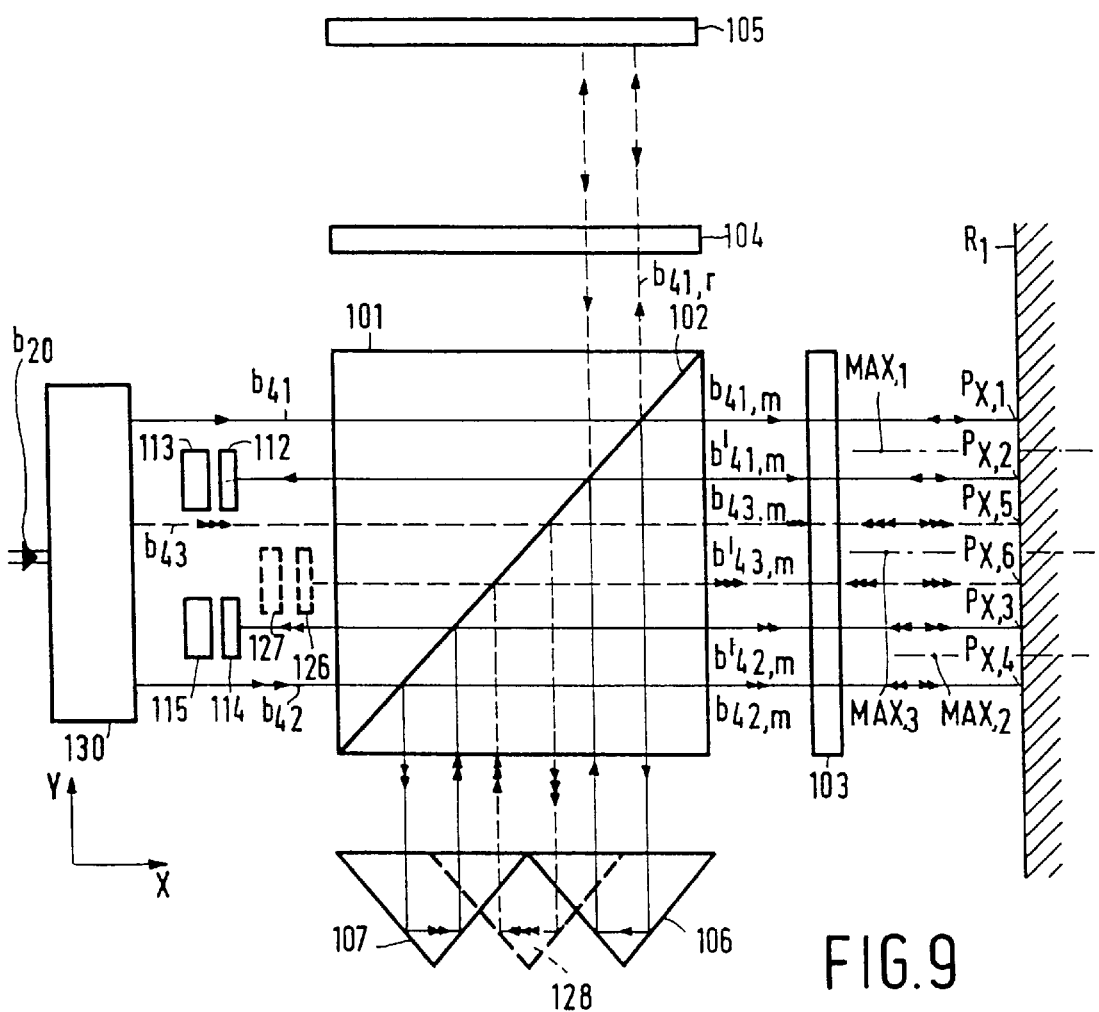
Figure 12:
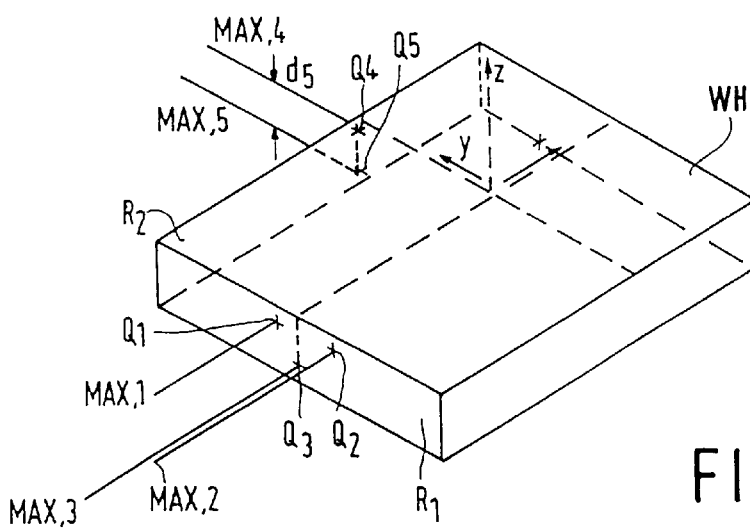
Figure 10:
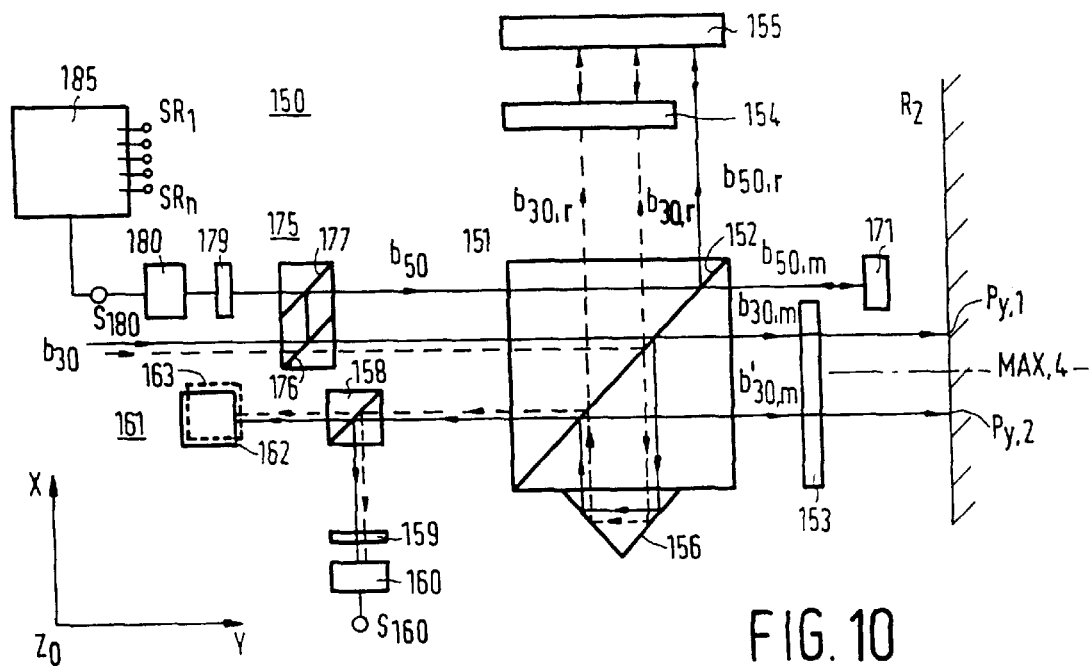
Figure 11:
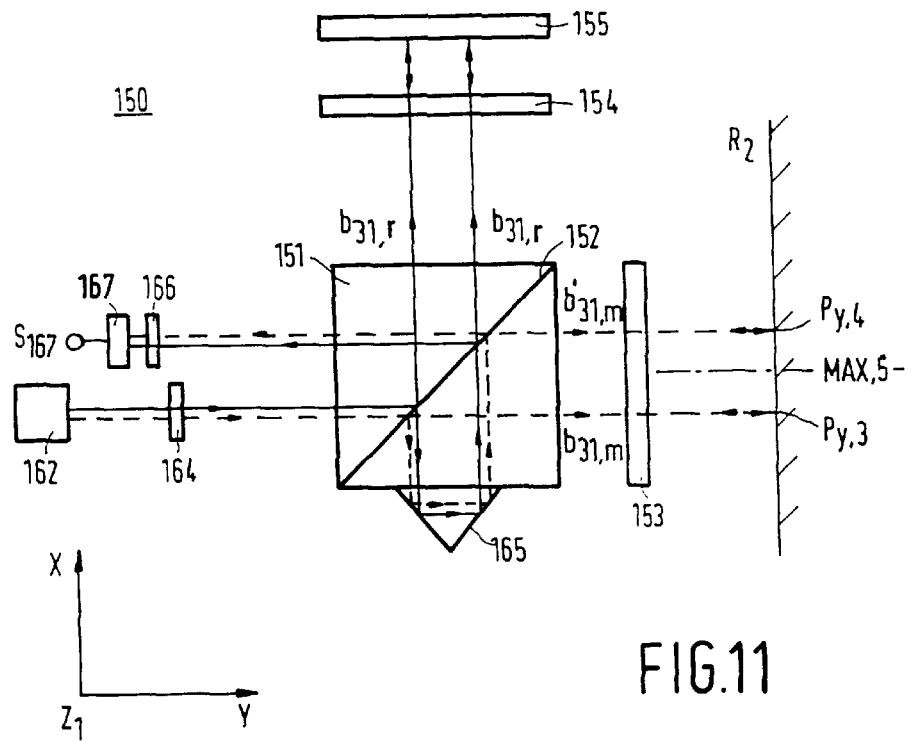
Figure 13:
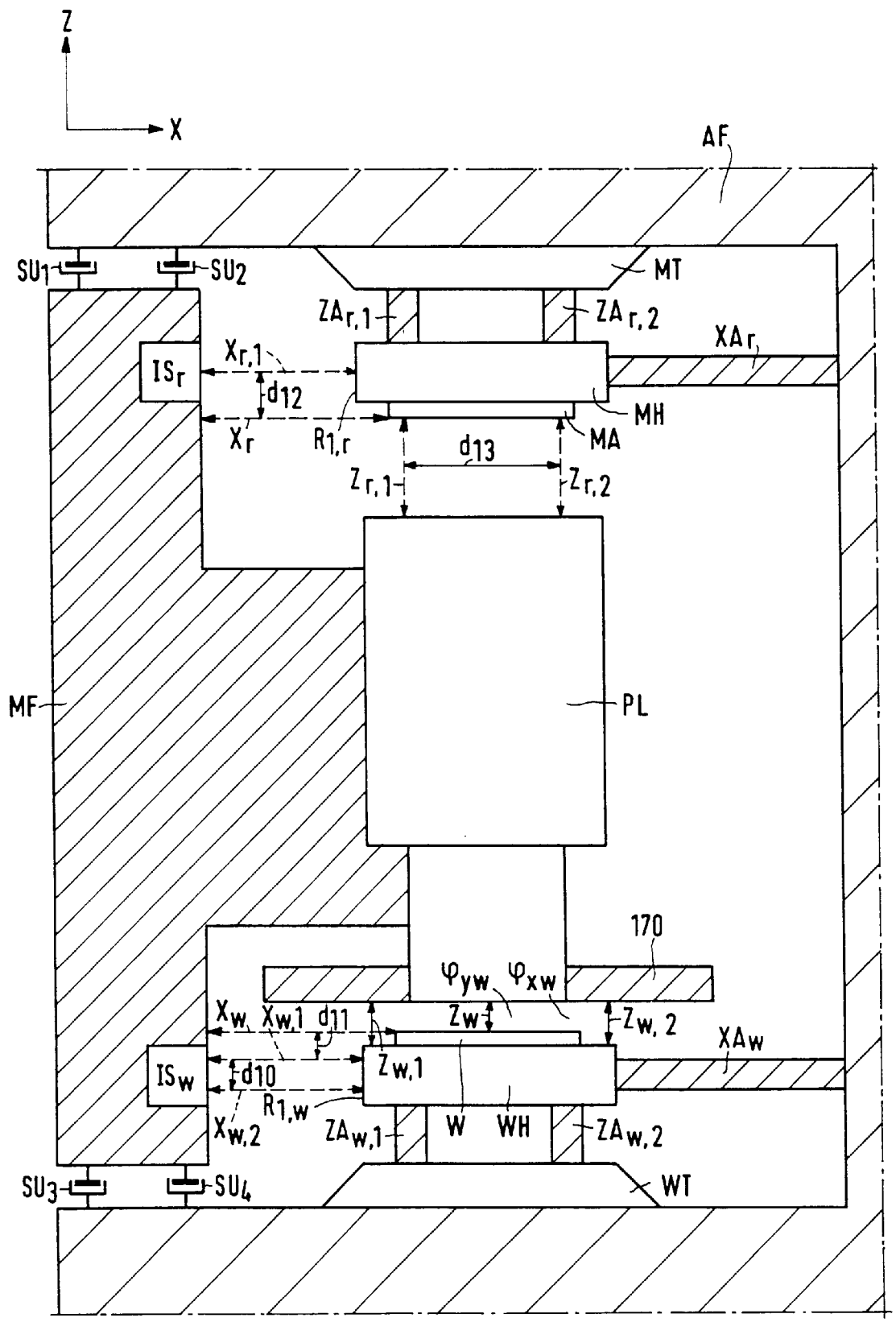
Figure 14:
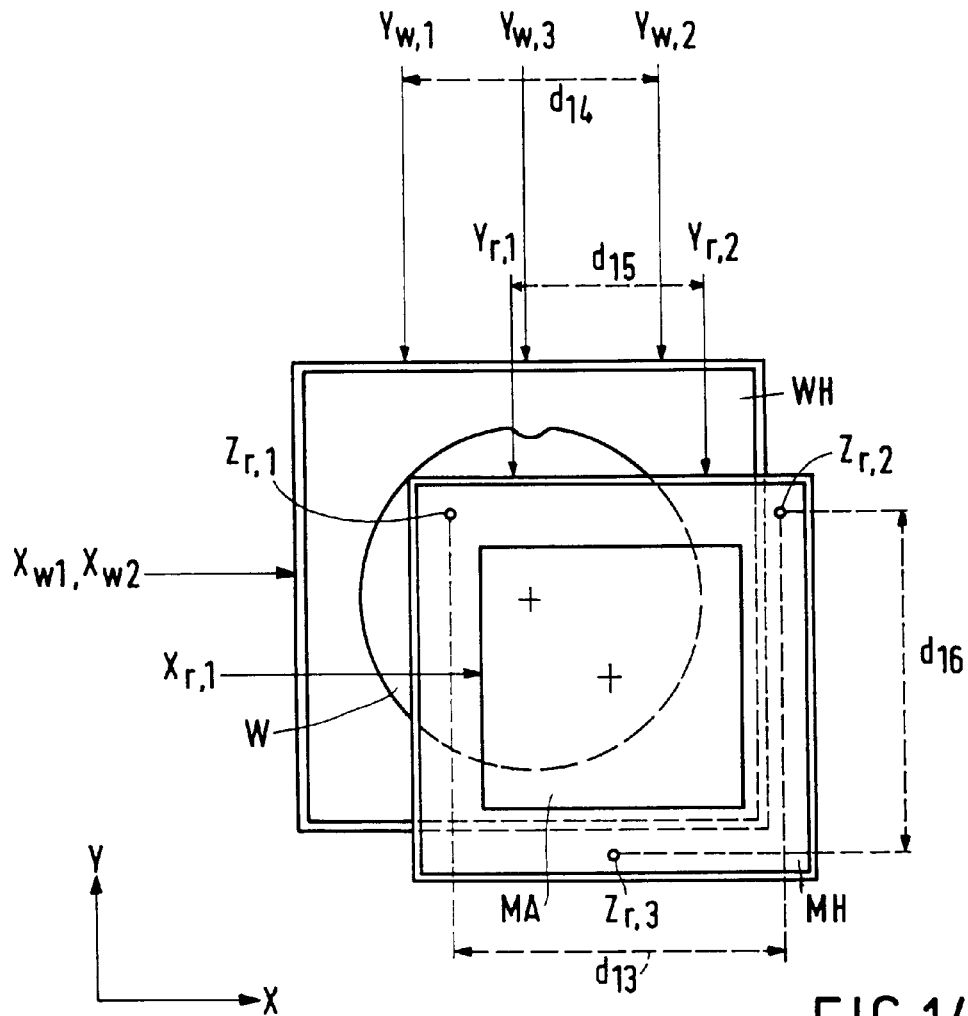
Figure 17:
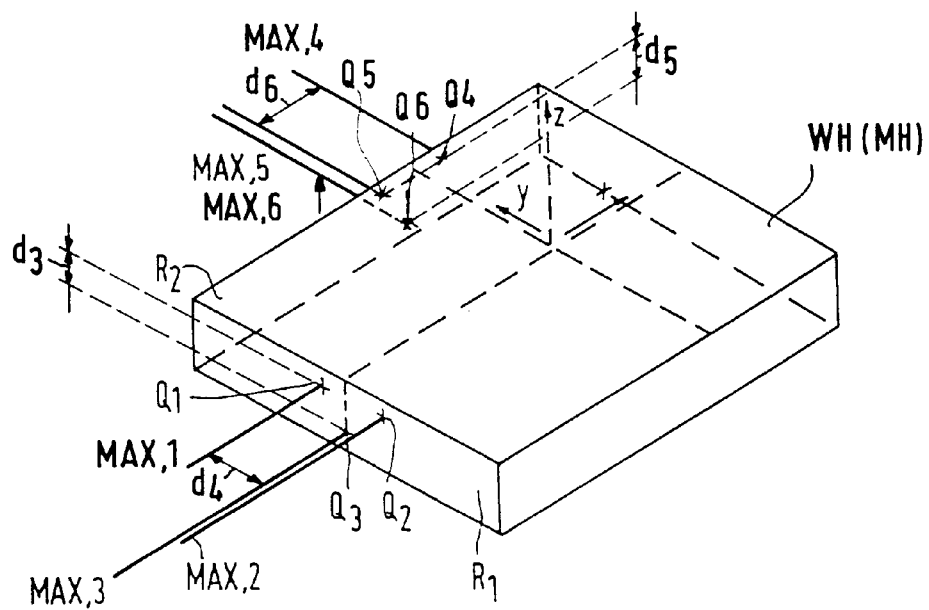
Figure 15:
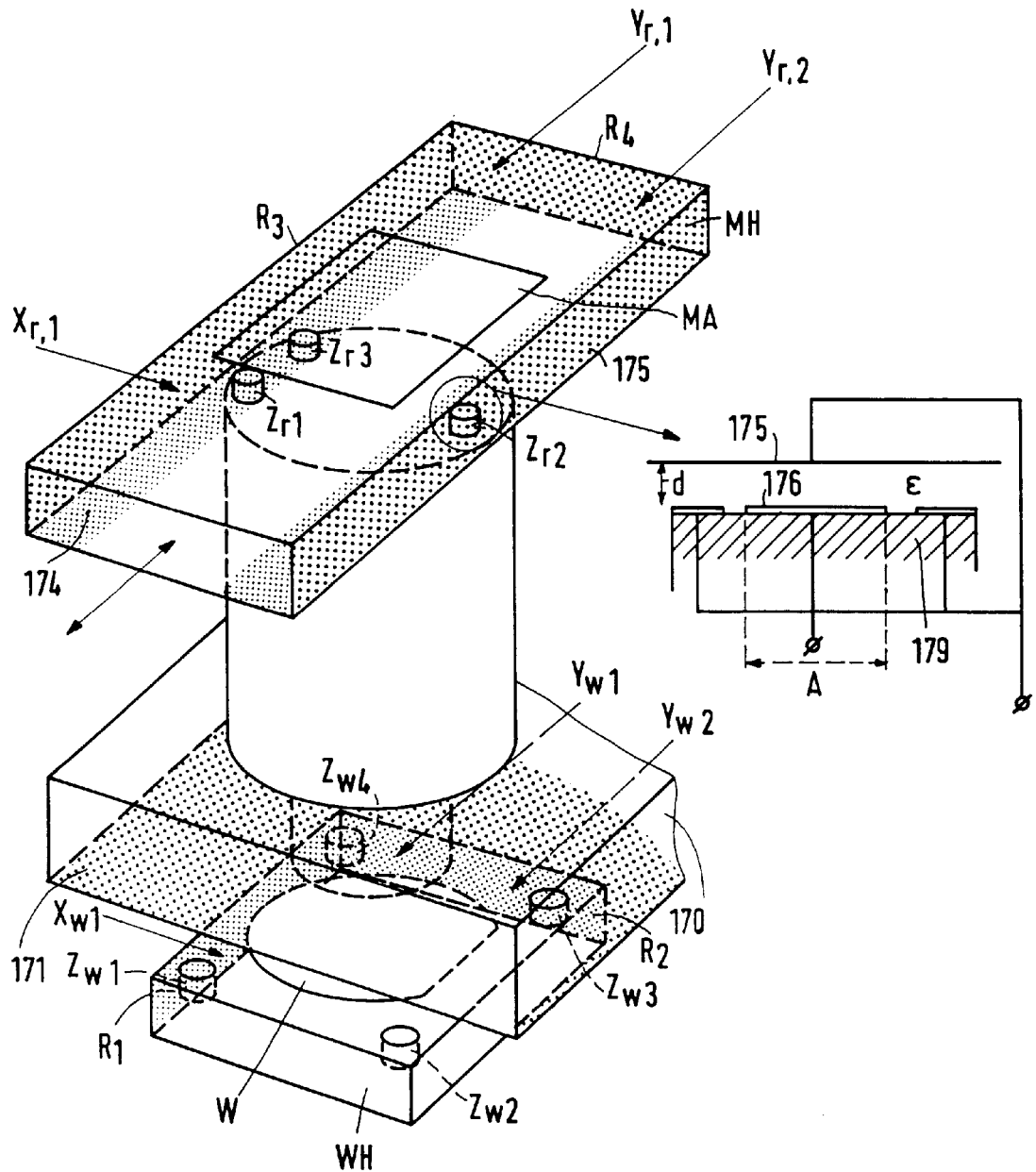
Figure 16:
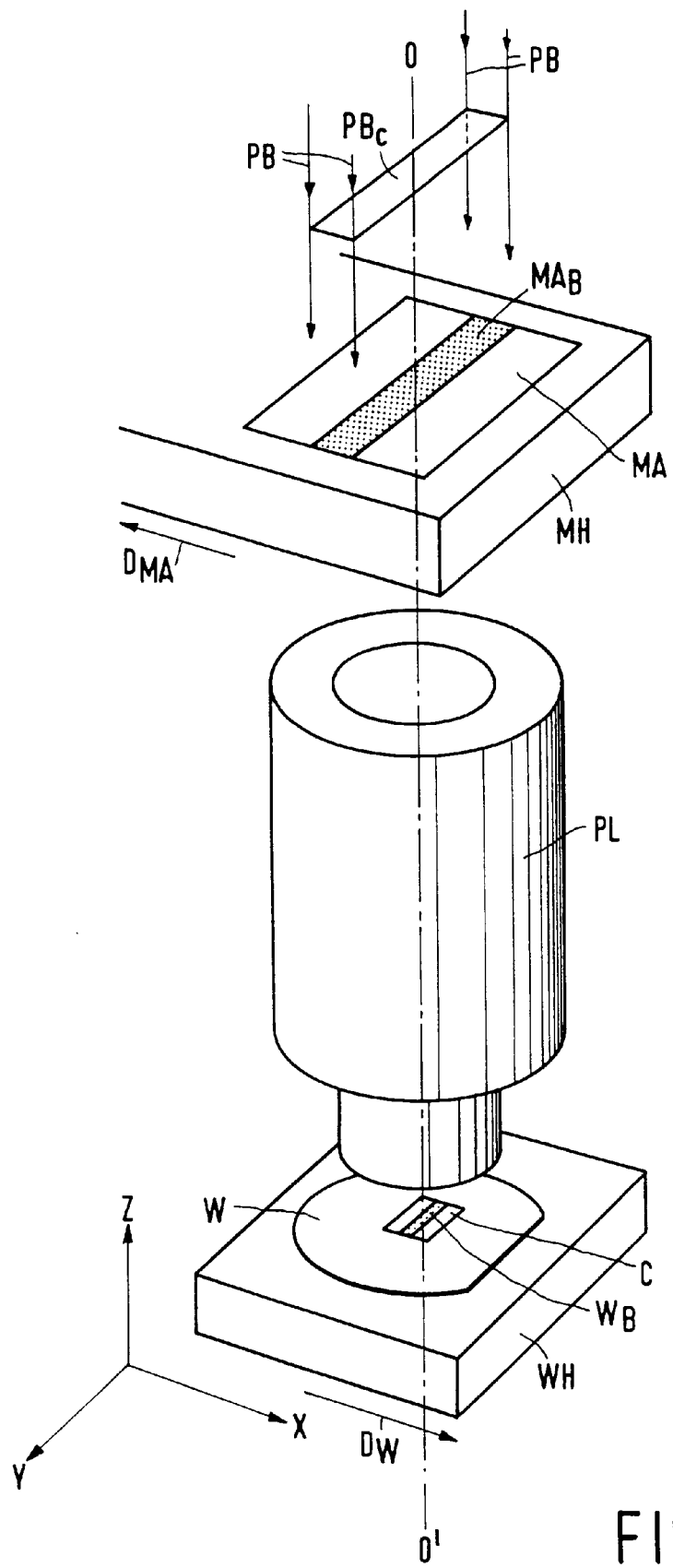

FIG. 1 shows diagrammatically an embodiment of an apparatus for step-and-scan imaging of a mask pattern on a substrate, FIG. 2 shows a known two-axis interferometer system, FIG. 3 shows the principle of a known one-axis interferometer system, FIG. 4 is a perspective view of a six-axis interferometer system, FIGS. 5 and 6 show a first embodiment of a three-axis interferometer system in accordance with two cross-sections in different X-Y planes, FIG. 7 shows a reflector for this embodiment, FIG. 8 shows the positions where the measuring beams impinge on a measuring mirror and where the measuring axes intersect these mirrors, FIG. 9 shows a second embodiment of a three-axis interferometer unit, FIGS. 10 and 11 show an embodiment of a two-axis interferometer unit in accordance with two cross-sections in different X-Y planes, FIG. 12 shows the positions where the five measuring axes of the interferometer system intersect the two measuring mirrors of the substrate holder, FIGS. 13 and 14 are overviews of the positions to be determined and the measuring axes to be used for this purpose, FIG. 15 shows an apparatus according to the invention, using capacitive sensors for the mask and the substrate, FIG. 16 shows the illumination principle of an imaging projection apparatus, and FIG. 17 shows the principle of planeness measurements of mirrors by means of a six-axis interferometer system.

FIG. 1 shows diagrammatically the optical elements of an embodiment of an apparatus for step-and-repetitively imaging a mask pattern on a substrate. The main component of this apparatus is a projection column accommodating a projection lens system PL. A mask holder MH for a mask MA, in which the mask pattern C to be imaged is provided, is arranged above this system. The mask holder is present in a mask table MT. A substrate table WT is arranged below the projection lens system PL. This table accommodates a substrate holder WH for a substrate W on which the mask pattern must be imaged a number of times, each time in a different substrate area, an IC area, Wd. The substrate table is movable in the X and Y directions so that, after imaging of the mask pattern on an IC area, a subsequent IC area can be positioned underneath the mask pattern.

The apparatus further has an illumination system which comprises a radiation source LA, for example, a Krypton-Fluoride Excimer Laser or a mercury lamp, a lens system LS, a mirror RE and a condenser lens Co. The projection beam PB supplied by the illumination system illuminates the mask pattern C. This pattern is imaged by the projection lens system PL on an area in the substrate W. The projection lens system has a magnification of, for example, M=¼, a numerical aperture NA=0.6 and a diffraction-limited image field having a diameter of 22 mm.

The apparatus further comprises a plurality of measuring devices, namely a device for aligning the mask MA with respect to the substrate W in the XY plane, an interferometer system for determining the position and orientation of the substrate holder and hence of the substrate, and a focus error detection device for determining a deviation between the focal or image plane of the projection lens system PL and the surface of the substrate W. These measuring devices are parts of servosystems which comprise electronic signal-processing and control circuits and drivers, or actuators, with which the position and orientation of the substrate and the focusing can be corrected with reference to the signals supplied by the measuring devices.

The alignment device uses two alignment marks $M_1$ and $M_2$ in the mask MA, indicated in the top right corner of FIG. 1. These marks preferably consist of diffraction gratings, but they may be alternatively formed by other marks, such as squares or strips which are optically different from their surroundings. The alignment marks are preferably two-dimensional, i.e. they extend in two mutually perpendicular directions, the X and Y directions in FIG. 1. The substrate W, for example, a semiconductor substrate on which the pattern C must be imaged at juxtaposed positions several times, has at least two alignment marks, preferably also two-dimensional diffraction gratings, two of which, $P_1$ and $P_2$, are shown in FIG. 1. The marks $P_1$ and $P_2$ are located outside the areas on the substrate W where the images of the pattern C must be formed. The grating marks $P_1$ and $P_2$ are preferably phase gratings and the grating marks $M_1$ and $M_2$ are preferably amplitude gratings.

FIG. 1 shows a special embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$, respectively. The beam b is reflected by a reflecting element 30, for example, a mirror to the reflecting surface 27 of a prism 26. The surface 27 reflects the beam b to the substrate alignment mark $P_2$ which passes a part of the radiation as beam b, to the associated mask alignment mark $M_2$ where an image of the mark $P_2$ is formed. A reflecting element 11, for example, a prism is arranged above the mark $M_2$, which prism directs the radiation passed by the mark $M_2$ towards a radiation-sensitive detector 13.

The second alignment beam b' is reflected by a mirror 31 to a reflector 29 in the projection lens system PL. This reflector 29 passes the beam b' to a second reflecting surface 28 of the prism 26, which surface directs the beam b' onto the substrate alignment mark $P_1$. This mark reflects a part of the radiation of the beam b' as beam $b_1'$ to the mask alignment mark $M_1$ where an image of the mark $P_1$ is formed. The radiation of the beam $b_1'$ passing through the mark $M_1$ is directed towards a radiation-sensitive detector 13' by a reflector 11'.

The operation of the double alignment device is described in U.S. Pat. No. 4,778,275.

The embodiment of the alignment device according to FIG. 1 is particularly suitable for an apparatus in which an illumination beam having a short wavelength, for example, 248 nm, and an alignment beam having a considerably longer wavelength, for example, 633 nm are used.

Since the projection lens system is designed for the wavelength of the projection beam PB, deviations occur when using this system PL for imaging the alignment marks $P_1$, $P_2$ and $M_1$, $M_2$ on each other by means of the alignment beam. The substrate alignment marks will not be imaged in the plane of the mask pattern in which the mask alignment marks are located but at a certain distance therefrom, this distance depending on the difference between the wavelengths of the projection beam and the alignment beam and the difference between the refractive indices of the material of the projection lens elements for the two wavelengths. If the projection beam has a wavelength of, for example 248 nm, and the alignment beam has a wavelength of 633 nm, this distance may be up to 2 m. Moreover, due to said wavelength difference, a substrate alignment mark is imaged on a mask alignment mark with a magnification which deviates from the desired magnification, with the deviation increasing with an increasing wavelength difference.

To correct for said deviations, an extra lens, or correction lens, 25 is incorporated in the projection column PL. The correction lens is arranged at such a height in the projection column that, on the one hand, the sub-beams of the different diffraction orders of the alignment beam, which sub-beams are formed by a substrate alignment mark, are sufficiently separated in the plane of the correction lens so as to be able to influence these sub-beams separately, and, on the other hand, this correction lens has a negligible influence on the projection beam and the mask image formed therewith. The projection lens is preferably arranged in the Fourier plane of the projection lens system. If the correction lens 25 is arranged in a plane in which the chief rays of the alignment beams $b_1$ and $b_1'$ intersect each other, as is shown in FIG. 1, this lens can be used for correcting the two alignment beams.

If desired, a wedge or another deflection element, such as a diffractor element, may be arranged in the proximity of an alignment mark in the path of the alignment beam(s). With such a deflection element (not shown in FIG. 1), alignment errors may be prevented, which result from unintentional phase differences within the selected alignment beam portions captured by the detector 13 or 13', which phase differences may occur if the symmetry axis of the alignment beam portions coming from a substrate alignment mark is not perpendicular to the mask plate, so that false reflections may occur within this plate. An alignment device provided with such a deflection element is described in European Patent Application no. 0 467 445.

In addition to the global alignment marks $P_1$ and $P_2$ shown in FIG. 1, which marks are used for aligning the substrate with respect to the mask, referred to as global alignment, the substrate may be provided with further alignment marks per IC area so as to align the relevant area with respect to the mask pattern for each IC area. The mask may comprise more than two alignment marks, while the further alignment marks may be used, for example, to measure the rotation of the mask about the Z axis so as to correct therefor.

The projection apparatus further comprises a focus error detection system for determining a deviation between the focal plane of the projection lens system PL and the surface of the substrate W so that this deviation can be corrected, for example, by moving the projection lens system along its axis. This system may be constituted by the elements 40, 41, 42, 43, 44, 45 and 46 which are arranged in a holder (not shown) which is fixedly connected to the projection lens system. The reference numeral 40 denotes a radiation source, for example a diode laser emitting a focusing beam $b_3$. This beam is directed at a very small angle onto the substrate by a reflecting prism 42. The beam reflected by the substrate is directed towards a retroreflector 44 by the prism 43. The element 44 reflects the beam in itself so that this beam ($b_3'$) once more traverses the same path via reflections on the prism 43, the substrate W and the prism 42. The beam $b_3'$ reaches a radiation-sensitive detection system 46 via a partially reflecting element 41 and a reflecting element 45. This detection system comprises, for example, a position-dependent detector or two separate detectors. The position of the radiation spot formed by the beam $b_3'$ on this system is dependent on the extent by which the focal plane of the projection lens system coincides with the plane of the substrate W. Reference is made to U.S. Pat. No. 4,356,392 for an extensive description of the focus error detection system.

For accurately determining the X and Y positions of the substrate table WT, known step-projection apparatuses comprise a multi-axis interferometer system. U.S. Pat. No. 4,251,160 describes a two-axis system and U.S. Pat. No. 4,737,283 describes a three-axis system. In FIG. 1, such an interferometer system is diagrammatically represented by the elements 50, 51, 52 and 53, the Figure showing only one measuring axis, the X axis. A beam $b_4$ emitted by a radiation source 50 in the form of a laser is split into a measuring beam $b_{4,m}$ and a reference beam $b_{4,r}$ by a beam splitter 51. The measuring beam reaches a reflecting side face 54 of the substrate holder WH and the reflected measuring beam is combined by the beam splitter with the reference beam reflected by a stationary retroreflector 52, for example, a "corner cube". The intensity of the combined beam is measured with the aid of a detector 53 and the displacement, in this case in the X direction, of the substrate holder WH can be derived from the output signal of this detector, and also an instantaneous position of this holder can be established.

As is diagrammatically shown in FIG. 1, the interferometer signals, represented by one signal $S_{53}$ for the sake of simplicity, and the signals $S_{13}$ and $S_1'$ of the alignment detection device are applied to a signal-processing unit SPU, for example a microcomputer, which processes said signals to control signals $S_{AC}$ for an actuator AC with which the substrate holder WH is moved in the X-Y plane via the substrate table WT.

With an interferometer system, which does not only comprise the X measuring axis shown in FIG. 1 but also a Y measuring axis and possibly a third measuring axis, the positions of, and the mutual distance between, the alignment marks $P_1$, $P_2$ and $M_1$, $M_2$ in a system of coordinates defined by the stationary interferometer system can be laid down during the initial, or global, alignment of the mask with respect to the substrate. This interferometer system is also used so as to be able to move the substrate table very accurately, which is necessary for a step-projection apparatus so as to be able to step very accurately from a first IC area to a second IC area.

In the described step-and-scan apparatus in which the mask and the substrate must also be moved synchronously during the projection of a mask pattern in one IC area, the mask must also be moved accurately in one direction, the scan direction. To this end, the apparatus should be provided with a second interferometer system with which the movement of the mask can be measured accurately. This interferometer system comprises the elements 60, 61, 62, 63 and 64 which have the same function as the elements 50, 51, 52, 53 and 54. The mask interferometer system signals, represented by one signal $S_{63}$ for the sake of simplicity in FIG. 1, are applied to the signal processing unit SPU in which these signals are compared with the corresponding signals of the substrate interferometer system. It can then be ascertained whether the mask and the substrate have the mutually correct position and/or move synchronously.

If the positions in the X and Y directions of the mask are represented by $X_r$, $Y_r$ and those of the substrate by $X_w$, $Y_w$ and the rotation of the Z axis is represented by $\phi_{z,r}$ and $\phi_{z,w}$, the following conditions will be satisfied if the mask and the substrate are correctly positioned with respect to each other:

$$X_w - MX_r = 0 \quad (1)$$

$$Y_w - MY_r = 0 \quad (2)$$

$$\phi_{z,w} - \phi_{z,r} = 0 \quad (3)$$

in which M is the magnification of the projection lens system. It has been assumed that the mask and the substrate move in opposite directions. If these elements move in the same direction, the minus sign for M should be replaced by a plus sign in the afore-mentioned conditions.

To ascertain whether these conditions are fulfilled, it is sufficient that both the interferometer system for the substrate and that for the mask have three measuring axes.

However, the substrate interferometer system preferably has five measuring axes. Then, in addition to $X_w$, $Y_w$ and $\phi_{z,w}$, also $\phi_{x,w}$ and $\phi_{y,w}$, i.e. the tilts about the X axis and Y axis, can be measured.

To be able to measure such tilts of the mask, a five-axis mask interferometer system may be used, or a combination of a three-axis interferometer system for determining $X_r$, $Y_r$ and $\phi_{z,r}$, and other sensors, such as capacitive sensors, for the $\phi_{x,r}$ and $\phi_{y,r}$ measurements.

If $X_w$, $Y_w$, $\phi_{x,w}$, $\phi_{y,w}$ are $X_r$, $Y_r$, $\phi_{z,r}$, $\phi_{x,r}$, $\phi_{y,r}$ are measured, and, with the aid of the focus detection system, $Z_w$ and $Z_r$, i.e. the positions along the Z axis of the substrate and the mask, then it can be ascertained whether not only the conditions (1), (2), (3) but also the conditions:

$$M^2 \cdot Z_w - Z_r = 0 \quad (4)$$

$$M \cdot \phi_{x,w} - \phi_{x,r} = 0 \quad (5)$$

$$M \cdot \phi_{y,w} - \phi_{y,r} = 0 \quad (6)$$

are satisfied. As already noted, a three-axis interferometer system can be used for measuring the movements along the X and Y axes and for determining the final positions of, for example, the mask holder, and for determining the rotation of the mask about the Z axis. Such a system, an embodiment of which is described in "SPIE, vol. 1088: Optical/Laser Microlithography, pp. 268–272, Linear/angular displacement interferometer for waferstage metrology", is diagrammatically shown in FIG. 2, together with the mask holder MH.

The composite interferometer system comprises a Helium-Neon laser 70, two beam splitters 71 and 72 and three interferometer units 73, 74 and 75. A part of the beam $b_5$ from the laser is reflected by the beam splitter 71 as beam $b_6$ to the interferometer unit 73 which cooperates with the mirror $R_1$ of the mask holder MH. The beam $b_7$ passed by the beam splitter 71 is split by the beam splitter 72 into a beam $b_8$ which is reflected to the interferometer unit 74 and into a beam $b_9$ which is passed to the interferometer unit 75. The interferometer unit 74 cooperates with the mirror $R_1$, while the interferometer unit 75 cooperates with the mirror $R_2$.

FIG. 3 shows the principle of the interferometer unit 73. This unit comprises a beam splitter 80, for example, a partially transparent mirror which splits the incoming beam $b_6$ into a measuring beam $b_{6,m}$ and a reference beam $b_{6,r}$. The measuring beam is passed to the mask holder mirror $R_1$ which reflects this beam to the beam splitter 80 which in its turn reflects a part of the beam $b_{6,m}$ to the detector 76. The beam $b_{6,r}$ reflected by the beam splitter 80 is reflected to the beam splitter 80 by a fixedly arranged reference mirror 81 which passes a part of this beam to the detector 76. When the mask holder mirror is moved in the X direction, constructive and destructive interferences alternately occur between the beams $b_{6,m}$ and $b_{6,r}$ incident on the detector 76, so that the output signal of this detector passes from a maximum value to a minimum value, and conversely, whenever the substrate table is displaced over a distance of $\lambda/4$, in which $\lambda$ is the wavelength of the beam $b_6$. The number of maxima and minima of the detector signal $S_{76}$ is a measure of the displacement of the holder in the X direction. Movements of the mirrors $R_1$ and $R_2$ which are much smaller than $\lambda/4$, for example, up to $\lambda/128$ or even $\lambda/512$ can be measured with the aid of electronic interpolation methods known in the interferometer technique.

The interferometer units 74 and 75 have the same construction and operate in the same way as the interferometer unit 73. The movement of the mask holder in the Y direction is measured by means of the interferometer unit 75 and the associated detector 78. A second X displacement measurement is performed with the interferometer unit 74 and the associated detector 77. The rotation of the holder about the Z axis is computed from the signals $S_{76}$ and $S_{77}$. This rotation is given by $$\varphi_z = \frac{S_{76} - S_{77}}{d_i}$$

in which $d_i$ is the distance between the points where the chief rays of the measuring beams $b_{6,m}$ and $b_{8,m}$ impinge upon the mirror $R_1$.

It is to be noted that FIG. 3 only shows the principle of an interferometer unit. In practice, a polarization-sensitive beam splitter 80 and a number of $\lambda/4$ plates, represented by the elements 82 and 83 in FIG. 3, will be used for beam splitting and combination. Then the radiation loss is minimal, which is particularly important if only one laser 70 is to be used for the different interferometer units. Furthermore, retroreflectors as described in said article in SPIE, Vol. 1088, Optical/Laser Microlithography II, pp. 268–272 may be incorporated in the interferometer units.

In principle, a three-axis interferometer system could be used for measuring the X and Y displacements of the substrate. To achieve the desired accuracy with this system, the following two conditions should be fulfilled:

1. The chief rays of the interferometer beams must be located in the plane of the substrate.
2. During the displacements along the X and Y axes and the possible rotation about the Z axis, the substrate holder must be fixed in the other degrees of freedom $\phi_{x,w}$, $\phi_{y,w}$. As described in European Patent Application no. 0 498 499, the conditions, which can hardly or not easily be fulfilled in practice, can be circumvented by making use of a five-axis interferometer system with which more movements of the substrate can be measured, so that this provides the possibility of measuring the X and Y movements more accurately.

FIG. 4 shows the principle of the five-axis interferometer system for measuring the five degrees of freedom X, Y, $\phi_{x,w}$, $\phi_{y,w}$ and $\phi_{z,w}$ of the substrate holder WH with an integrated mirror block. The system comprises, for example, two interferometer units 100 and 150 to which the beams $b_{20}$ and $b_{30}$ are supplied. These beams are emitted by a laser, for example a Helium-Neon laser, 50. The beam $b_{10}$ coming from this laser first passes a beam-widening optical system diagrammatically shown by means of the lens 90 and is subsequently split into the two beams $b_{20}$ and $b_{30}$ by a beam splitter 92. The elements 91, 93 and 94 are mirrors which ensure that the beams are deflected in such a way that they are incident on the interferometer units 100 and 150 at the correct angles. The interferometer unit 100 may be implemented in such a way that it emits three measuring beams towards the mirror $R_1$ and receives these beams from this mirror. With these beams, the displacement in the X direction, the tilt about the Y axis, $\phi_{Y,W}$, and the rotation about the Z axis, $\phi_{Z,W}$, of the mirror block and substrate holder WH can be measured. The second interferometer unit 120 sends two measuring beams to, and receives two measuring beams from, the mirror $R_2$. With these beams, the displacement in the Y direction and the tilt about the X axis can be measured.

The interferometer units may be implemented in various ways. FIG. 5 shows an embodiment of the interferometer unit 100. It comprises a polarization-sensitive beam splitter 101, two $\lambda/4$ plates 103, 104, a reference mirror 105, two retroreflectors 106, 107, a composite prism 108 and two detectors 113, 115. The detectors may be arranged on the plane 95 of the interferometer unit 100 shown in FIG. 4. The interferometer unit is of the heterodyne type. The beam $b_{20}$ then comes from a Helium-Neon laser which is implemented as a Zeeman laser. Such a laser supplies a beam with two mutually perpendicularly polarized components which have an optical phase difference of, for example 20 MHz. These two components are shown in FIG. 5 by means of solid lines and broken lines.

The beam $b_{20}$ entering the prism 101 is split into a measuring beam $b_{20,m}$ and a reference beam $b_{20,r}$ by the polarization-sensitive interface 102. The beam $b_{20,m}$ is passed to the mirror $R_1$ of the substrate holder and is reflected by this mirror. A $\lambda/4$ plate 103 ensuring that the direction of polarization of the reflected beam, which has traversed the $\lambda/4$ plate twice, is rotated through 90° with respect to the direction of polarization of the ongoing beam $b_{20,m}$ is arranged between the prism 101 and the mirror $R_1$. The reflected beam is then reflected by the interface 102 to a retroreflector 106, for example, in the form of a three-dimensional corner cube prism. The beam reflected by the prism is subsequently reflected by the interface 102 and sent as measuring beam $b'_{20,m}$ to the mirror $R_1$ again and reflected by this mirror to the prism again. This beam has then again traversed the $\lambda/4$ plate twice so that it is now passed by the interface 102. The beam $b'_{20,m}$ subsequently reaches a prism system 108 and is reflected by its surface 109 to a radiation-sensitive detector 113 via an analyzer 112.

The reference beam $b_{20,r}$ reflected by the interface 102 traverses the $\lambda/4$ plate 104, is reflected by the reference mirror 105 and traverses the $\lambda/4$ plate a second time. The direction of polarization of the beam incident on the interface 102 is rotated through 90° so that it is passed on to the retroreflector 106. The beam $b'_{20,r}$ reflected by this element is again sent as a reference beam to the reference mirror 105 and reflected by this mirror to the interface 102, the direction of polarization being rotated through 90° again. The interface 102 subsequently reflects the beam to the prism system 108 whose face 109 sends the beam $b'_{20,r}$ to the detector 113. The direction of polarization of the analyzer 112 extends at an angle of 45° to the two mutually perpendicular directions of polarization of the beams $b'_{20,m}$ and $b'_{20,r}$. The components of the beams $b'_{20,m}$ and $b'_{20,r}$ passed by the analyzer have the same direction of polarization and interfere with each other. The output signal $S_{113}$ of the detector 113 has an intensity modulation at a frequency which is equal to the Zeeman frequency difference plus or minus a frequency shift which is dependent on the displacement of the substrate holder mirror $R_1$ in the X direction.

In principle, the retroreflector 106 could also be omitted so that the measuring beam and the reference beam incident on the detector 113 would only be reflected once by the substrate table mirror $R_1$ and the reference mirror 105, respectively.

The special embodiment of the interferometer according to FIG. 5, in which use is made of the retroreflector 106 to reflect the measuring beam twice as beams $b_{20,m}$ and $b'_{20,m}$ on the substrate mirror, has the great advantage that the direction of the measuring beam $b'_{20,m}$ ultimately incident on the detector 113 is independent of a tilt of the mirror $R_1$ about an axis perpendicular to the X axis. As a result, the signal $S_{113}$ contains only true X displacement information. For the same reason, a possible tilt of the reference mirror 105 does not have any influence on the signal $S_{113}$.

The rotation of the substrate table about the Z axis, which is perpendicular to the plane of the drawing in FIG. 5, can also be measured by means of the interferometer unit of FIG. 5. This is effected via a second X measurement at a position $P_{x,3}$ ($P_{x,4}$) at a maximum possible distance from the position $P_{x,1}$ ($P_{x,2}$) where the first X measurement is performed. To this end, the face 110 of the prism system 108 is in the form of a partially transparent mirror which reflects a portion of the measuring beam $b'_{20,m}$ and the reference beam $b'_{20,r}$ as a new reference beam $b_{21,r}$ and a new measuring beam $b_{21,m}$, respectively, to the beam splitter 101. The direction of polarization of the two beams is first rotated through 90° by means of the $\lambda/20$ plate 116 so that the functions of these beams are interchanged. The measuring beam $b_{21,m}$ is passed to the substrate holder mirror by the polarization-sensitive interface 102, while the reference beam $b_{21,r}$ is reflected to the reference mirror. The paths traversed by the beams $b_{21,m}$ and $b_{21,r}$ are analogous to those traversed by the beams $b_{20,m}$ and $b_{20,r}$. Preferably, a second retroreflector 107 is provided which ensures that the measuring beam and the reference beam are sent a second time to the substrate holder mirror $R_1$ and the reference mirror as beams $b'_{21,m}$ and $b'_{21,r}$. Via the beam splitter 101, the prism system 108 and a second analyzer 114, the reflected beams $b'_{21,m}$ and $b'_{21,r}$ reach a second detector 115 where they interfere with each other.

The output signal $S_{115}$ of this detector has an intensity modulation at a frequency which is equal to the Zeeman difference frequency plus or minus a frequency shift which, however, is now dependent on the possible rotation of the mirror $R_1$ about the Z axis. In fact, if such a rotation occurs, the frequency shift between the measuring and reference beams at their first passage through the system, at which reflections occur at the positions $P_{x,1}$ and $P_{x,2}$, is different from the frequency shift at the second passage through the system, at which reflections occur at the positions $P_{x,3}$ and $P_{x,4}$. The frequency difference measured by means of the detector 115 is the difference between said frequency shifts. If the substrate table mirror does not have a rotation about the Z axis, the resultant frequency difference is equal to zero.

For the way in which the signals $S_{113}$ and $S_{115}$ can be electronically processed so as to derive the X displacement and the rotation $\phi_z$ about the Z axis of the substrate table from the frequency shifts, reference may be made by way of example to the article in SPIE, Vol. 1088 "Optical/Laser Microlithography" II, 1989, pp. 268–272.

Instead of a beam $b_{20}$ with two frequency components, a beam having only one frequency may be used. The displacement or rotation of the mirror $R_1$ is then measured by determining the phase difference between the measuring and reference beams.

A third measurement, for example, of the tilt about the Y axis can be performed with the interferometer unit. To this end, for example, the face 109 of the prism system 108 may be implemented as a partially transparent mirror which passes a portion of the beams $b'_{20,m}$ and $b'_{20,r}$ as is shown in FIG. 5. A reflector system 120 is arranged in the path of the beam portions which have been passed. This system must reflect the beams to the beam splitter 101 and displace these beams parallel to themselves in the Z direction so that the beams will extend in a second XY plane which is located in front of or behind the plane of the drawing in FIG. 5. This plane is shown in FIG. 6, together with the third measuring beam $b_{22,m}$ and reference beam $b_{22,r}$.

The path of the beams $b_{22,m}$ and $b_{22,r}$ in front of the beam splitter 101 incorporates a λ/20 plate 125 which rotates the direction of polarization of these beams through 9°, so that the functions of the reference beam and the measuring beams are interchanged. Preferably, there is a third retroreflector 128, so that the measuring beam is reflected twice, as beams $b_{22,m}$ and $b'_{22,m}$, at the positions $P_{x,5}$ and $P_{x,6}$, respectively, by the substrate table mirror $R_1$, and the reference beam is reflected twice, as beams $b_{22,r}$ and $b'_{22,r}$, by the reference mirror. The paths traversed by the measuring beams and reference beams are analogous to those traversed by the measuring beams $b_{20,m}$ and $b'_{20,m}$ and the reference beams $b_{20,r}$ and $b'_{20,r}$ in FIG. 5.

The beams $b'_{22,m}$ and $b'_{22,r}$ ultimately reach a polarization analyzer 126 which passes the components having the same direction of polarization of these beams, which components interfere with each other, to a detector 127. The output signal $S_{127}$ of this detector has an intensity modulation at a frequency which is equal to the Zeeman difference frequency plus or minus a frequency shift which is dependent on the possible tilt of the mirror $R_1$ about the Y axis. In fact, if such a tilt occurs, the frequency shift between the measuring beam $b'_{20,m}$ and the reference beam $b'_{20,r}$ differs from the frequency shift between the measuring beam $b'_{22,m}$ and the reference beam $b'_{22,r}$. The frequency difference measured by means of the detector 127 is the difference between these frequency shifts. If the substrate holder does not have a tilt about the Y axis, the resultant frequency difference is equal to zero. This tilt can also be measured by means of a single frequency beam and by determining phase differences.

FIG. 7 shows an embodiment of the reflector system 120 in detail. This system comprises a first reflector 121, which reflects the beams $b'_{20,m}$ and $b'_{20,r}$ extending parallel to the X axis towards the Z axis, and a second reflector 122, which reflects these beams again in a direction parallel to the X axis. The reflector pair 121, 122 thus displaces the beams parallel to themselves along the Z axis.

In the embodiment of FIGS. 6 and 7, in which the beams $b_{22,m}$ and $b'_{22,m}$ are displaced in the Z direction only, the points $P_{x,5}$ and $P_{x,6}$ where the chief rays of these measuring beams impinge upon the substrate holder mirror $R_1$ have the same X positions as the points $P_{x,2}$ and $P_{x,3}$ where the chief rays of the measuring beams $b'_{20,m}$ and $b'_{21,m}$ impinge upon this mirror. This is shown in FIG. 8 for the sake of clarity. In this Figure, the points where the chief rays of the measuring beams $b_{20,m}$, $b'_{20,m}$, $b_{21,m}$, $b'_{21,m}$, $b_{22,m}$ and $b'_{22,m}$ are incident on the mirror $R_1$ are denoted by the circles $P_{x,1}$, $P_{x,2}$, $P_{x,3}$, $P_{x,4}$, $P_{x,5}$ and $P_{x,6}$, respectively. A so-called measuring axis is associated with each pair of measuring beams. These measuring axes are denoted by $MAX_1$, $MAX_2$ and $MAX_3$ in FIGS. 5 and 6. The points where these measuring axes intersect the mirror $R_1$ are denoted by $Q_1$, $Q_2$ and $Q_3$, respectively, in FIG. 8.

The point $Q_3$ is preferably located in a plane through the optical axis $A_{PL}$ of the projection lens system and perpendicular to the plane of the drawing in FIG. 8, hence perpendicular to the mirror $R_1$. The points $Q_1$ and $Q_2$ are preferably located symmetrically with respect to this plane, so that the line of connection 1 between the points $Q_1$ and $Q_2$ is parallel to the image plane IP of the projection lens system, which image plane coincides with the substrate surface WP if this surface is an ideal surface.

The measuring beams and the measuring axes are further preferably parallel so as to prevent interference patterns instead of a single radiation spot from occurring at the location of the detectors 113, 115 and 127. This parallelism, which is determined by the planeness of the surfaces of the beam splitter 101, of the prism system 108 and of the reflector system 120, and by the angle between the surfaces 109 and 110 of the prism system 108 and the angle between the surfaces 121 and 122 of the reflector system, can be satisfactorily realized in practice because said surfaces can be accurately flattened within 3 angle seconds and because said angles can be made accurately equal to 90°. The reflector system 120 is preferably integrated with the prism system 108 so as to avoid alignment problems during assembly and to ensure stability with time.

The distance $d_2$ between the image plane IP and the line of connection 1 must be as short as possible. The distance $d_3$ between the line 1 and the point $Q_3$ and the distance $d_4$ between the points $Q_1$ and $Q_2$ should be as long as possible so as to be able to measure the tilt $\phi_y$, and the rotation $\phi_z$ as accurately as possible. On the other hand, these distances should remain limited so as to limit the dimensions and hence the weight of the mirror $R_1$. In a realized embodiment of the device, the distances $d_3$ and $d_4$ are of the order of 20 mm, while the distance $d_2$ is of the order of 7 mm.

The interferometer unit shown in FIGS. 5 and 6 has the advantage that the measuring beam and reference beam associated with a measuring axis are symmetrical with respect to the beam splitter 101 and have the same path lengths through this beam splitter. This substantially eliminates the risk of instabilities.

In the device according to FIGS. 5 and 6, the differences between the signals associated with the measuring axes $MAX_1$, $MAX_2$ and $MAX_3$, which differences are required for measuring the rotation $\phi_z$ and the tilt $\phi_y$, are determined optically. If the information obtained via the measuring axes is represented by $I_{MAX,1}$, $I_{MAX,2}$ and $I_{MAX,3}$, the detector signals $S_{113}$, $S_{115}$ and $S_{127}$ in the embodiment of FIGS. 5 and 6 are given by $S_{113} = I_{MAX,1}$ $S_{115} = I_{MAX,1} - I_{MAX,2}$ $S_{127} = I_{MAX,1} - I_{MAX,3}$ The measuring axis information as a function of the detector signals is:

$I_{MAX,1} = S_{113}$ $I_{MAX,2} = S_{113} - S_{115}$ $I_{MAX,3} = S_{113} - S_{127}$

The signals $S(X)$, $S(\phi_z)$ and $S(\phi_y)$ which comprise information about the magnitude and direction of the displacement along the X axis, the rotation about the Z axis and the tilt about the Y axis then are:

$$S(X) = \frac{I_{MAX,1} + I_{MAX,2} + I_{MAX,3}}{3}$$

$$S(\phi_z) = \frac{I_{MAX,1} + I_{MAX,2}}{d4}$$

$$S(\phi_y) = \frac{I_{MAX,1} + I_{MAX,3}}{d3}$$

or:

$$S(X) = \frac{S_{113} + (S_{113} - S_{115}) + (S_{113} - S_{127})}{3} = S_{113}S_{115} + \frac{S_{127}}{3}$$

The X position, the rotation about the Z axis and $$S(\varphi_z) = \frac{S_{113} - (S_{113} - S_{115})}{d4} = \frac{S_{115}}{d4}$$

$$S(\varphi_y) = \frac{S_{113} - (S_{113} - S_{127})}{d3} = \frac{S_{127}}{d3}$$

the tilt about the Y axis of the substrate can be determined by means of these signals.

Alternatively, the difference between the signals associated with the different measuring axes may be determined electronically instead of optically. Then, three separate beams should be supplied to the beam splitter 101, as is shown in FIG. 9.

The path of the beam $b_{20}$ incorporates, in front of the polarization-sensitive beam splitter 101, a polarization-insensitive beam splitter 130 which splits the beam $b_{20}$ into a first and a second beam $b_{41}$ and $b_{42}$ whose principal axes are located in a first X-Y plane, the plane of the drawing in FIG. 9, and a third beam $b_{43}$ whose principal axis is located in a second X-Y plane in front of or behind the plane of the drawing in FIG. 9. The beam splitter 130 comprises a combination of partially or not partially transparent reflectors and may be implemented in various ways. For example, the reflectors may be faces of plane-parallel plates, so that the beams $b_{41}$, $b_{42}$, and $b_{43}$ are satisfactorily parallel. Each of these beams is split by the interface 102 into a measuring beam and a reference beam $b_{43,m}$ and $b_{43,r}$, $b_{42,m}$ and $b_{42,r}$ and $b_{41,m}$ and $b_{41,r}$, respectively. For the sake of clarity, only a part of the radiation path is shown for the reference beam $b_{41,r}$.

Preferably, retroreflectors 106, 107 and 128 are arranged in the paths of the beams $b_{41}$, $b_{42}$ and $b_{43}$, so that the measuring beams $b'_{41,m}$, $b'_{42,m}$ and $b'_{43,m}$ leaving the beam splitter are reflected twice by the substrate holder mirror $R_1$. Each measuring beam, together with the associated reference beam, is incident on a separate detector 113, 115 or 127 via an analyzer 112, 114 and 126. For the sake of clarity in FIG. 9, the Y positions of the points $P_{x,5}$ and $P_{x,6}$ where the chief rays of the measuring beams $b_{43,m}$ and $b'_{43,m}$ impinge upon the mirror $R_1$, are different from those of the points $P_{x,2}$ and $P_{x,3}$ where the beams $b'_{41,m}$ and $b_{42,m}$ impinge upon the mirror. However, the Y position of $P_{x,5}$ and $P_{x,6}$ preferably coincides with that of $P_{x,2}$ and $P_{x,3}$, respectively, so that the situation of FIG. 8 is obtained again.

For the embodiment of FIG. 9, the relationship between the detector signals $S_{113}$, $S_{115}$ and $S_{127}$ and the information obtained via the measuring axes is as follows:

$S_{113} = I_{MAX,1}$ $S_{115} = I_{MAX,2}$ $S_{127} = I_{MAX,3}$.

The measuring signals S(X), S($\phi_z$) and S($\phi_y$) may now be:

$$S(X) = \frac{I_{MAX,1} + I_{MAX,2} + I_{MAX,3}}{3}$$

$$S(\varphi_z) = \frac{I_{MAX,1} + I_{MAX,2}}{d4}$$

$$S(\varphi_Y) = \frac{\frac{I_{MAX,1} + I_{MAX,2}}{2} - I_{MAX,3}}{d3}$$

and, in terms of detector signals:

$$S(X) = \frac{S_{113} + S_{115} + S_{127}}{3}$$

$$S(\varphi_z) = \frac{S_{113} + S_{115}}{d4}$$

$$S(\varphi_y) = \frac{S_{113} + S_{115}}{2} - S_{127}$$

The choice between a device with three independent measuring axes and a device with three coupled measuring axes is determined by the extent to which an interferometer error $\Delta$ may affect the measuring signals S(X), S($\Phi_z$) and S($\Phi_y$). The interferometer error $\Delta$ is the error caused by the interferometer itself in the detector signals $S_{113}$, $S_{115}$ and $S_{127}$. When such an error $\Delta$ occurs in each detector signal, the error in the measuring signals, in the case of three independent measuring axes, is:

$$\Delta S(X) = \frac{\Delta + \Delta + \Delta}{3} = \Delta$$

$$\Delta S(\varphi_Z) = \frac{\Delta + \Delta}{d4} = \frac{2\Delta}{d4}$$

$$\Delta S(\varphi_y) = \frac{\frac{\Delta + \Delta}{2} + \Delta}{d3} = \frac{3\Delta}{3d_3}$$

and in the case of three coupled measuring axes:

$$\Delta S(X) = \Delta + \frac{\Delta + \Delta}{3} = \frac{5}{3}\Delta$$

$$\Delta S(\varphi_z) = \frac{\Delta}{d4}$$

$$\Delta S(\varphi_y) = \frac{\Delta}{d3}$$

In order to determine the displacement of the substrate holder in the Y direction and the tilt about the X axis, the composite interferometer system according to the invention includes a second interferometer unit which is denoted by 150 in FIG. 4. In principle, this interferometer has two measuring axes $MAX_{,4}$ and $MAX_{,5}$ and its structure is analogous to that of the interferometer unit 100. FIGS. 10 and 11 show the interferometer unit 150 in detail.

The incoming beam $b_{30}$, with two mutually perpendicularly polarized components having a given frequency difference, is split by the interface 152 of a beam splitter 151 into a measuring beam $b_{30,m}$ and a reference beam $b_{30,r}$. The measuring beam is reflected by the second substrate holder mirror $R_2$ and is reflected twice at the positions $P_{y,1}$ and $P_{y,2}$ in the presence of a retroreflector 156. The measuring beam $b'_{30,m}$ exiting from the beam splitter 151 is combined with the reference beam $b'_{30,r}$ which is reflected twice by the reference mirror 155. The two $\lambda/4$ plates 153 and 154 ensure that the measuring and reference beams acquire the direction of polarization which is desired for the second passage through the system. The beams $b'_{30,m}$ and $b'_{30,r}$ are sent to a detector 160 by a reflector 158, passing a polarization analyzer 159. The direction of polarization of this analyzer extends at an angle of 45° to the two mutually perpendicular directions of polarization of the beams $b'_{30,m}$ and $b'_{30,r}$, so that this analyzer passes components of the same directions of polarization of the beams, which components interfere with each other. The output signal $S_{160}$ of the detector 160 then has an intensity modulation at a frequency which is equal to the difference frequency of the beams $b_{30,m}$ and $b_{30,r}$ plus or minus a frequency shift which is determined by the displacement of the substrate holder in the Y direction.

To enable measurement of the tilt of the substrate holder about the X axis, the reflector 158 may be implemented as a partially transparent mirror. The portions of the beams $b'_{20,m}$ and $b'_{30,r}$ passed by this element are reflected to the beam splitter 151 by a reflector system 161. This system may comprise two mirrors 162 and 163 at an angle of 45° to the X-Y plane in FIG. 10. The mirror 162 reflects the beam portions in the Z direction and the mirror 163 subsequently ensures that the beam portions will extend in the Y direction again, but then in a second X-Y plane which is located in front of or behind the plane of the drawing in FIG. 10. This second plane is the plane of the drawing in FIG. 11, which Figure shows how the beam portions reflected by the system 161 traverse the interferometer unit as a new measuring beam $b_{31,m}$ and a new reference beam $b_{31,r}$ and how they are reflected by the substrate holder mirror $R_2$ and the reference mirror 155. A $\lambda/2$ plate 164 is arranged in front of the beam splitter 151, which plate rotates the directions of polarization of the beams through 90°, so that the functions of the measuring beam and the reference beam are interchanged. In the presence of a retroreflector 165, the measuring beam is reflected twice, as measuring beam $b_{31,m}$ and $b'_{31,m}$, at the positions $P_{y,3}$ and $P_{y,4}$ by the mirror $R_2$, and the reference beam is reflected twice, as reference beams $b_{31,r}$ and $b'_{31,r}$, by the reference mirror.

The beams $b'_{31,m}$ and $b'_{31,r}$ ultimately reach a polarization analyzer 166 which passes the components having the same direction of polarization of these beams to a detector 167. The output signal $S_{167}$ of this detector has an intensity modulation at a frequency which is equal to the difference frequency of the beams $b_{30,m}$ and $b_{30,r}$ plus or minus a frequency shift which is dependent on a tilt $\phi_x$ of the mirror $R_2$ about the X axis. In fact, if such a tilt occurs, the frequency shift between the measuring beam $b'_{30,m}$ and the reference beam $b'_{30,r}$ differs from the frequency shift between the measuring beam $b'_{31,m}$ and the reference beam $b'_{31,r}$. The frequency difference measured by means of the detector 167 is the difference between these frequency shifts. If the substrate table does not have a tilt about the X axis, the resultant frequency difference is equal to zero.

The points $P_{y,3}$ and $P_{y,4}$ where the chief rays of the measuring beams $b_{31,m}$ and $b'_{31,m}$ impinge upon the mirror $R_2$ preferably have the same X positions as the points $P_{y,2}$ and $P_{y,1}$ where the chief rays of the measuring beams $b'_{30,m}$ and $b_{30,m}$ impinge upon this mirror, and the measuring axes $MAX_4$ and $MAX_5$ are directed perpendicularly to the Z axis. This is illustrated in FIG. 12. This Figure not only shows these measuring axes and the points of intersection $Q_4$ and $Q_5$ of these axes with the mirror $R_2$ of the substrate holder WT, but also the measuring axes $MAX_1$, $MAX_2$ and $MAX_3$ of the first interferometer unit and the points of intersection $Q_1$, $Q_2$ and $Q_3$ of these axes with the mirror $R_1$ of the substrate holder.

In the interferometer unit according to FIGS. 10 and 11, the difference between the signals associated with the measuring axes $MAX_4$ and $MAX_5$, which difference is required for determining the tilt $\phi_x$, is determined optically. If the information obtained via these measuring axes is repre-sented by $I_{MAX,4}$ and $I_{MAX,5}$, the detector signals $S_{160}$ and $S_{167}$ in the embodiment of FIGS. 10 and 11 are given by:

$S_{160} = I_{MAX,4}$
$S_{167} = I_{MAX,4} - I_{MAX,5}$

The measuring axis information as a function of the detector signals is:

$I_{MAX,4} = S_{160}$
$I_{MAX,5} = S_{160} - S_{167}$

The signals $S(Y)$ and $S(\phi_x)$ representing information about the magnitude and direction of the displacement along the Y axis and of the tilt about the X axis then are:

$$S(Y) = \frac{I_{MAX4} + I_{MAX5}}{2} S_{160} - \frac{1}{2}S_{167}$$

$$S(\varphi_x) = \frac{I_{MAX4} + I_{MAX5}}{d5} = \frac{S_{167}}{d5}$$

in which $d_5$ is the distance between the points $Q_4$ and $Q_5$ in FIG. 12.

Instead of using coupled measuring axes, as is shown in FIGS. 10 and 11, it is possible to use independent measuring axes for operating the interferometer unit 150 analogously as described with reference to the interferometer unit 100. In this case, the following relationships apply between the measuring axis information and the detector signals:

$S_{160} = I_{MAX,4}$
$S_{167} = I_{MAX,5}$ and for the measuring signals $S(Y)$ and $S\phi_x$:

$$S(Y) = \frac{I_{MAX4} + I_{MAX5}}{2} = \frac{1}{2}(S_{160} + S_{167})$$

$$S(\varphi_x) = \frac{I_{MAX4} + I_{MAX5}}{d5} = \frac{S_{160} - S_{167}}{d5}$$

The interferometer unit according to FIGS. 10 and 11 also provides the advantage that the associated measuring and reference beams traverse this unit symmetrically and cover the same distances through the beam splitter 151, which is very favorable from the point of view of stability, i.e. it is independent of temperature, humidity, etc.

In both interferometer units 100 and 150, it is not necessary for the detectors 113, 115, 127, 160 and 167 to be arranged directly behind the analyzers 112, 114, 126, 159 and 166 but, if desired, these detectors may be arranged at larger distances and possibly close together. Optical fibers can then be used to guide the beams to the detectors. Lenses for focusing the beams on the entrance planes of the fibers may be arranged between the analyzers and the fibers.

The prism retroreflectors, or three-dimensional "corner cubes", shown in FIGS. 5, 6, 9, 10 and 11 may also be replaced by what are called cat's eye retroreflectors. Such a cat's eye is constituted by a lens with a mirror arranged in its focal plane, and it ensures that not only the principal axis of the reflected beam is parallel to that of the incoming beam, but it also ensures that these principal axes coincide.

In view of the required accuracy of the composite interferometer system, changes of ambient parameters, such as temperature, pressure, humidity may be going to play a role. These changes cause a variation of the refractive index of the medium in which the interferometer beams propagate. To be able to determine this variation, so that it can be corrected, the interferometer system preferably has a sixth axis which is used as a reference axis along which a beam extends which cooperates with a fixedly arranged mirror. In FIG. 4, this mirror is denoted by the reference numeral 170 and the reference axis beam is denoted by $b_{50}$. The beam $b_{50}$ is preferably supplied by the second interferometer unit 150 and the beam coming from this unit is sent to the mirror 170 by a mirror 171.

FIG. 10 shows how the beam $b_{50}$ can be derived from the beam $b_{30}$, for example, by means of a prism system 175 comprising two reflectors 176 and 177. The first, partially transparent reflector 176 reflects a part of the beam $b_{30}$ to the second reflector 177 which sends this part as beam $b_{50}$ to the beam splitter 151. The interface 152 splits the beam $b_{50}$ into a measuring beam $b_{50,m}$ and a reference beam $b_{50,r}$. The last-mentioned beam is reflected to the reference mirror 155, while the measuring beam $b_{50,m}$ is passed on to the mirror 171 which is arranged, for example, at an angle of 45° to the plane of the drawing in FIG. 10. The measuring beam $b_{50,m}$ reflected by the fixedly arranged mirror 170 enters the beam splitter 151 via the mirror 171, in which beam splitter it is combined with the reference beam $b_{50,r}$ reflected by the reference mirror 155. Via a polarization analyzer 179, the combined beam reaches a detector 180 which may be arranged behind the prism system if the reflector 177 is a partially transparent reflector.

The measuring beam $b_{50,m}$ traverses a constant geometrical path length.

The optical path length, which is the product of the geometrical path length and the refractive index of the medium, is, however, influenced by a variation of the refractive index, hence also by the path length difference between the measuring beam $b_{50,m}$ and the reference beam $b_{50,r}$. The variation of the path length difference is measured by means of the detector 180 and the output signal $S_{180}$ can be used to correct the information obtained via the other measuring axes for the refractive index variations due to variations of the ambient parameters.

As is shown in FIG. 4, the reference mirror 170 for the reference axis is connected to the interferometer unit 150, preferably via a plate 190 of very stable material such as "zerodure" or "Invar". A very stable construction for the reference axis is then obtained.

The information of the reference axis of the six-axis interferometer system may also be used for correcting the measuring information from other optical measuring systems, such as a focus error detection system and/or a system for detecting local levelling of the substrate surface if the beams of these measuring systems traverse the same space as the interferometer beams.

Due to changes of the ambient parameters such as air pressure, temperature, humidity, etc., the refractive index of the medium within the projection lens system may be affected, which may result in variations of the imaging quality of the projection lens system. The signal generated by means of the reference axis of the composite interferometer system may be used for correcting the imaging quality. This may be effected, for example, by adjusting one or more of the following parameters:

the wavelength of the projection beam the gas pressure within the projection lens system the temperature within the projection lens system the composition of the medium in one or more of the compartments within the projection lens system the mutual distance between the lens elements in the projection lens system.

Furthermore, also the zero setting of the alignment device, and the zero setting of the focusing device could be adjusted by means of said signal.

To obtain the control signals required for this purpose, the output signal $S_{180}$ of the detector 180 is applied to an electronic signal-processing unit 185. As is diagrammatically shown in FIG. 10 by means of the signals $SR_1 \ldots SR_n$, various servosystems of the projection apparatus can be controlled from the unit 185. It is to be noted that the zero settings and the correction of the imaging quality by means of the reference axis signal may alternatively be realized in an apparatus without local levelling of the object or substrate.

For measuring variations of the refractive index, it is sufficient to use one measuring beam. However, if desired, a double measuring beam and a double reference beam may also be realized for the reference axis, as has been described in the foregoing for the other measuring axes. In that case, the measuring beam $b_{50,m}$ and the reference beam $b_{50,r}$ must traverse the λ/4 plate 153 and the λ/4 plate 154, respectively, and a retroreflector, at the location of the retroreflector 156, must also be arranged for the reference axis. The measuring and reference beams of the reference axis then traverse the system according to FIG. 10 in an analogous way as the measuring beams $b_{30,m}$, $b'_{30,m}$ and the reference beams $b_{30,r}$, $b'_{30,r}$ of the fourth measuring axis.

An even greater accuracy of the composite interferometer system can be obtained if it is ensured that the same circumstances prevail in the entire space in which the interferometer beams propagate. This can be realized by passing a constant, preferably laminar stream of air through this space, as has been described in European Patent Application no. 0 498 499. In this Application, embodiments of the interferometer unit other than those shown in FIGS. 5, 6, 9, 10 and 11 are described.

As is diagrammatically shown in FIG. 1 by means of the elements 60–64, the projection apparatus comprises a second interferometer system for measuring the movements and the positions of the mask. If the movements along the X and Y axis and the rotation $\phi_{z,r}$ about the Z axis are to be measured with this second system, it will be sufficient to use a three-axis interferometer system, such as the system shown in FIG. 2, having two X measuring axes and one Y measuring axis.

If also tilts about the X and Y axes must be measured, separate sensors may be used for this purpose, such as capacitive sensors which are relatively inexpensive, particularly when the mask must not be moved in one direction only, the scan direction, along a relatively large distance.

If during projection of the mask pattern on one IC area, the mask pattern and the substrate must perform a number of scanning movements in opposite directions, in which case the mask pattern and the substrate must be displaced in the direction perpendicular to the scan direction between two successive scan movements, a five-axis interferometer system which is similar to the system described with reference to the circuit diagram shown in FIG. 4 and the embodiments shown in FIGS. 5, 6, 9, 10 and 11, or other embodiments described in European Patent Application No. 0 498 499 may be used for measuring the mask movements.

FIG. 13 shows diagrammatically and in the form of a cross-section in the XZ plane an overview of the positions which have to be determined and of the measuring axes to be used for this purpose. This Figure also shows an important further aspect, namely the projection lens system PL, the interferometer system $IS_r$ for the mask and the interferometer system $IS_w$ for the substrate are arranged in one frame referred to as the metrology frame MF, so that $IS_r$, $IS_w$ and PL are rigidly fixed with respect to each other. The mask pattern image formed by the projection lens system PL is thereby coupled to the interferometer systems. The metrology frame also accommodates the capacitive sensors, to be described hereinafter, for the mask and the focus error detection system. Since the measuring mirrors $R_{1,2}$ and $R_{1,w}$ of the mask interferometer system and the substrate interferometer system, respectively, are parts of the mask holder MH and the substrate holder WH on which the mask MA and the substrate W are rigidly fixed, the movements of the mask and the substrate are directly measured with these systems. Consequently, these measurements and the mask pattern image formed are not affected by movements of other components of the apparatus, such as actuators for adjustment along the Z axis of the substrate and the mask.

The actuators for displacing the mask and the substrate in the X and Y directions, of which only the X actuators $XA_r$ and $Xa_w$ are illustrated by way of rods in FIG. 13, form part of the actuator frame AF.

The metrology frame is suspended in the actuator frame by means of diagrammatically shown dynamic isolators $SU_1$, $SU_2$, $SU_3$ and $SU_4$ so that this frame is dynamically decoupled from the rest of the apparatus. The mask table MT and the substrate table WT are also arranged on the actuator frame. The mask table has three Z actuators, two of which, $ZA_{r,6}$ and $ZA_{r,2}$ are shown, with which the Z position of the mask can be adjusted by equal energization of the actuators, or with which a tilt of the mask can be realized by unequal energization of the actuators. These movements can be realized also for the substrate in an analogous manner, because the substrate table is also provided with three Z actuators, two of which, $ZA_{w,1}$ and $ZA_{w,2}$, are shown.

The vertical position of the substrate with respect to the projection lens system $P_1$, diagrammatically shown by means of $Z_w$, can be measured with a focus error detection system as shown by way of the elements 40–46 in FIG. 1. A preferred embodiment of such a system is described in U.S. Pat. No. 5,191,200. The Z actuators $ZA_{w,2}$, $ZA_{w,1}$ can be controlled by means of the focus error signal supplied by a focus error detection system, such that $Z_w$ is adjusted at a constant value and does not have to be taken into account when processing the measuring signals of the substrate interferometer system.

The elements of the focus error detection system, with which measurements with respect to the substrate surface take place, may be arranged on a plate 170 secured to the projection lens PL. This plate may also serve as a reference plate for the substrate holder, for example, if the distance between the projection lens and the substrate holder is measured with capacitive sensors at different positions. The measuring parameters $\phi_{w,x}$ and $\phi_{y,x}$ between the projection lens reference plate 170 and the substrate indicate that the tilts of the substrate about the Z and Y axes are measured.

FIG. 14 shows the determinations of the positions and the associated measuring axes which cannot be shown in FIG. 13. This Figure is a very diagrammatic plan view of the mask holder MH and the subjacent substrate holder WH, which holders are mutually offset for the sake of clarity in the X and Y directions. As is shown in FIGS. 13 and 14, the X position of the substrate $X_w$ and that of the mask $X_r$, the Y position of the mask $Y_r$ and that of the substrate $Y_w$ (not shown in the Figures) and the rotation about the Z axis of the substrate $\phi_{z,x}$ and that of the mask $\phi_{z,2}$ are determined. It should further be ensured that the mask and the substrate are both either correctly horizontal or have the same tilts about the X and Y axes, so that $\phi_{w,x}$, $\phi_{y,w}$ and $\phi_{z,r}$, $\phi_{y,r}$ must also be measured. To be able to perform these measurements, the substrate interferometer system comprises the following measuring axes: $X_{w,1}$ $X_{w,2}$, $y_{w,1}$, $Y_{w,2}$, $Y_{w,3}$.

It is to be noted that the interferometer system in this embodiment comprising two X measuring axes and three Y measuring axes is different than that described with reference to FIGS. 4, 5, 6, 9 and 10; this system comprises two Y measuring axes $Y_{w,1}$, $Y_{w,2}$ and three X measuring axes $X_{w,1}$, $X_{w,2}$ and $X_{w,3}$ which are denoted by $MAX_4$, $MAX_5$, MAX, $MAX_2$, $MAX_3$, respectively, in the Figures.

Instead of the measurements X and Y indicated in FIG. 14, the measurements Z and Z indicated in FIG. 13 may also be performed.

As is indicated in FIGS. 13 and 14, the mask interferometer system may comprise three measuring axes $X_{r,1}$, $Y_{r,1}$ and $Y_{r,2}$. Moreover, as is shown by means of $Z_{r,1}$, $Z_{r,2}$ and $Z_{r,3}$ in FIG. 14, the local height (Z position) of the mask must be determined at three positions of the mask.

The distance between the measuring axis $X_{w,1}$ and the plane of the substrate is indicated by $d_{11}$, the distance between the measuring axis $X_{r,1}$ and the plane of the mask is indicated by $d_{12}$, the distance between the height measuring points $Z_{r,1}$ $Z_{r,2}$, on the one hand, and $Z_{r,2}$, $Z_{r,3}$, on the other hand, is indicated by $d_{13}$ and $d_{16}$, and the distance between the pairs of measuring axes $X_{w,1}$, $X_{w,2}$ and $Y_{w,1}$, $Y_{w,2}$ and $Y_{r,1}$, $Y_{r,2}$ is indicated by $d_{10}$, $d_{14}$ and $d_{15}$, respectively. For this embodiment, the desired measuring signals are given by:

$$x_w = \frac{\frac{1}{2}d_{10} - d_{11}}{d_{10}} \cdot w_{w,1} + \frac{\frac{1}{2}d_{10} + d_{11}}{d_{10}} \cdot w_{w,2} \tag{7}$$

$$y_w = \frac{\frac{1}{2}d_{10} - d_{11}}{2d_{10}} \cdot (y_{w,1} + y_{w,2}) + \frac{\frac{1}{2}d_{10} + d_{11}}{d_{10}} \cdot y_{w,3} \tag{8}$$

$$\varphi_{z,w} = \frac{y_{w,1} - y_{w,2}}{d_{14}} \tag{9}$$

$$x_z = x_{r,1} + d_{12} \cdot \frac{z_{r,1} - z_{r,2}}{d_{13}} \tag{10}$$

$$y_r = \frac{y_{r,1} + y_{r,2}}{2} + \frac{d_{12}}{d_{16}}\left(\frac{z_{r,1} + z_{r,2}}{2} - z_{r,3}\right) \tag{11}$$

$$\varphi_{z,r} = \frac{y_{r,1} - y_{r,2}}{d_{15}} \tag{12}$$

The substrate and the mask are and remain correctly positioned with respect to each other, if the following conditions are satisfied:

$$X_w - M.X_r = 0 \tag{1}$$

$$Y_w - M.Y_r = 0 \tag{2}$$

$$\phi_{z,w} - \phi_{z,r} = 0 \tag{3}$$

and also:

$$M^2.Z_w - Z_r = 0 \tag{4}$$

$$M\phi_{x,w} - \phi_{x,r} = 0 \tag{5}$$

$$M\phi_{y,w} - \phi_{y,r} = 0 \tag{6}$$

For measuring the height position of the mask, for example, capacitive sensors $Z_{r,1}$, $Z_{r,2}$ and $Z_{r,3}$, as shown in FIG. 15, may be used. In this Figure, also all measuring planes used in the apparatus are illustrated by means of a pattern of dots. The mask holder comprises, as optical measuring planes, the two measuring mirrors $R_3$ and $R_4$ which cooperate with a three-axis interferometer system with which, for example, $X_{r,1}$, $Y_{r,1}$ and $Y_{r,2}$ are measured. Moreover, this holder is provided at its lower side with two electrically conducting faces 174 and 175 which form part of the capacitive sensors $Z_{r,1}$, $Z_{r,2}$ and $Z_{r,3}$. The effect of a capacitive sensor is illustrated in the right central part of FIG. 15. A second conductor 176 having a surface size A arranged on an isolator 179 is present at a distance d from the face 175. If the medium between the conductors 175 and 176 has a dielectric constant E, the capacitance C is given by: C=E.A/w. By measuring this capacitance, which is dependent on the distance d between the conductors 175 and 176, the local distance between the projection lens and the mask holder, hence the local height of the mask, can be directly measured. When using three sensors and comparing their measuring results, the tilts about the X and Y axes may also be determined.

Instead of capacitive sensors, also other sensors such as pneumatic sensors or optical sensors may be used. In the latter case, the faces 174 and 175 must be reflective, hence they should be optical measuring faces again. The optical sensors may be constituted by the optical read heads developed for reading optical audio discs known as CDs. These heads have the advantage of a small size and low cost.

FIG. 15 shows an alternative for the substrate position measurement. Instead of a five-axis interferometer system, a three-axis interferometer system is now used. With this system, which cooperates with the measuring mirrors $R_1$ and $R_2$ on the substrate holder WH, the position in the X direction ($X_{w,1}$), the position in the Y direction ($Y_{w,1}$) and the rotation about the Z axis ($Y_{w,1}-Y_{w,2}$) of the substrate are determined. The tilts about the X axis and the Y axis and the distance between the projection lens and the substrate may be determined in the same manner as for the mask, namely with the aid of the capacitive sensors $Z_{w,1}$, $Z_{w,2}$ and $Z_{w,3}$. To this end, the lower side of the reference plate 170 secured to the projection lens is adapted to conduct electrically so that this plate functions as one of the plates of the sensors. The capacitive sensors for the substrate may also be replaced by other sensors such as optical or pneumatic sensors.

It is to be noted that the apparatus may comprise an optical height meter in the form of a focus error detection system as described, for example, in U.S. Pat. No. 4,356,392, as well as a capacitive height measuring system as shown in FIG. 15. Moreover, the apparatus may include more than three capacitive sensors for the substrate and/or the mask. Moreover, the mask may not only have the marks used for the actual alignment, but also extra marks with which, for example, lens errors can be detected.

FIG. 16 has been incorporated to illustrate that a demagnified image of the mask MA is formed on the substrate WH in the present step-and-scan apparatus; the magnification M of the projection lens system is, for example, ¼. At the area of the mask, the projection beam has, for example, a rectangular cross-section $PB_C$ so that a rectangular part $MA_B$ of this mask is illuminated. This part is imaged by the projection lens system PL on a similarly rectangular part $W_B$ of the substrate W. By moving the mask with respect to the substrate synchronously in opposite X directions, as is shown by way of the arrows $D_{MA}$ and $D_W$ in FIG. 15, and by taking the magnification M into account, the entire mask is successively illuminated and the entire mask pattern is imaged on an IC area $W_d$ of the substrate. The mask and the substrate may also be moved in the same X direction. Then, the − sign should be replaced by a + sign in the conditions (1) and (2).

After the mask pattern has been imaged on a first IC area, the substrate holder is moved with respect to the mask along a distance which is equal to the period of the IC areas in the X direction or the Y direction, and the mask is imaged on a second IC area by the scanning radiation pattern $BP_C$.

The radiation pattern may alternatively have a different shape than a rectangular shape, for example, an arcuate shape. In practice, the width, measured in the X direction, of the radiation pattern is smaller than its length, measured in the Y direction.

In the projection apparatus described, two independent interferometer systems are used whose signals are jointly processed. The result of the signal processing operation should be available sufficiently rapidly so that the X, Y, $\phi_z$ so servosystems, or control loops, can be made sufficiently rapidly. In other words, the delay time elapsing between the instant when a measurement is performed and the instant when the desired measuring result is available should be sufficiently short. To this end, the signal-processing electronics in the positioning servosystems, inter alia, those of the interferometer systems should be sufficiently fast. For example, these electronics should be able to process signals at a frequency of the order of 30 MHz, if the required measuring accuracy is approximately 2 nm, the distance covered is of the order of 30 mm and the illumination time is of the order of 0.5 sec. Moreover, the electronics of the entire servosystem comprising all measuring axes of the interferometer system and the actuators controlled thereby should be synchronized.

When a five-axis interferometer system is used for the mask, or when a three-axis interferometer system is used in combination with capacitive or other contactless sensors, as well as all actuators for realizing the $X_r$, $Y_r$, $\phi_{z,r}$, $\phi_{x,r}$ and $\phi_{y,r}$ adjustments, no strict requirements need to be imposed on the journaling of the substrate holder and, for example, deviations of the order of 0.4 μm are permissible. Two loops are used which do not need to be equally fast. Preferably, the servoloop for the mask holder is faster than that for the substrate holder. The latter only uses the information of its own, five-axis interferometer system for adjusting the substrate holder position and orientation. Since the drive system for the mask holder is simpler than that for the substrate holder, the servoloop of the mask holder may be faster than that of the substrate holder. The servoloop of the mask holder ensures that conditions (1)–(6) are satisfied. Thus, the residual errors of the slower servoloop are corrected with the faster servoloop.

If more stringent requirements could be imposed on the journaling of the mask holder, for example, the deviation should be smaller than 0.4 μm, then the servoloop for the mask holder could be simpler. Then, no separate tilt actuator-sensor ($\phi_{x,r}$, $\phi_{y,r}$) would be necessary for the mask holder. Also the Y measurement and the Y actuator are then coupled to those of the substrate holder. The mask interferometer system then only needs to perform an X measurement and a $\phi_z$ measurement, and the servoloop only needs to comprise a X actuator and a $\phi_z$ actuator in the form of two X or two Y actuators.

The tilt measuring signals $\phi_{x,w}$ and $\phi_{y,w}$ supplied by the five-axis substrate holder interferometer system may be used in two manners. In an embodiment of the apparatus, in which the substrate is leveled per IC area, the tilt measuring signals may be used to correct the X, Y and $\phi_z$ measuring signals for the tilts of the substrate, which may occur due to this local leveling.

In an embodiment of the projection apparatus, in which no local leveling takes place, the tilt measuring signals may be used together with the other measuring signals for correcting the tilts of the substrate, which may occur when the substrate is displaced along a distance which is equal to the period of the IC areas, thus during stepping.

To be able to achieve the desired measuring accuracy with the interferometers, stringent requirements must be imposed on the planeness of the, relatively long, measuring mirrors. If for reasons of costs, these requirements are alleviated or if, also at higher costs, these requirements can no longer be satisfied in practice, possible unevennesses of the mirror may be detected before the actual measurements are performed, and the information thus obtained may be used to correct the actual measurements. To this end, use may be made of a six-axis interferometer system, whose sixth axis is not a reference axis but an extra measuring axis. Analogously as in FIG. 12 showing a five-axis interferometer system, FIG. 17 shows such a six-axis interferometer system. The interferometer units which measure in the X direction and the Y direction may be implemented again as described with reference to FIGS. 5, 6 and 9.

The X interferometer unit comprises the measuring axes MAX,1, MAX,2 and MAX,3 with which the X position, the tilt about the Y axis, $\phi_y$, and the rotation about the Z axis, $\phi_z$, are measured. If the above-mentioned notation is used, in which $I_{MAX,1}$ represents the information supplied by the measuring axis MAX,1, and if $S_x$ is the signal representing the X position of the object to be measured (a substrate holder in the relevant case), if $S(\phi_z)$ is the signal representing the rotation about the Z axis and if $S(\phi_y)$ is the signal representing the tilt about the Y axis, then the signals supplied by the X interferometer unit are:

$$S_x(X) = \frac{I_{MAX,1} + I_{MAX,2} + I_{MAX,3}}{3}$$

$$S_x(\varphi_z) = \frac{I_{MAX,1} - I_{MAX,2}}{d_4}$$

$$S_x(\varphi_y) = \frac{0.5 I_{MAX,1} + 0.5 I_{MAX,2} - I_{MAX,3}}{d_3}$$

in which $d_3$ and $d_4$ are the distances between the measuring axes MAX,2 and MAX,3 and MAX,1 and MAX,2, respectively, and in which the addition X denotes that the X interferometer unit is concerned.

Also the Y interferometer unit comprises three measuring axes MAX,4, MAX,5 and MAX,6. With these axes, the Y position, the tilt about the X axis, $\phi_x$, and the rotation about the Z axis, $\phi_z$ are measured. The associated signals are:

$$S_y(Y) = \frac{I_{MAX,4} + I_{MAX,5} + I_{MAX,3}}{3}$$

$$S_y(\varphi_z) = \frac{I_{MAX,4} - I_{MAX,5}}{d_6}$$

$$S_y(\varphi_y) = \frac{I_{MAX,4} + I_{MAX,5} - I_{MAX,6}}{d_5}$$

If the servoloops, consisting of the measuring systems and the actuators, are closed, the accuracies of the movements in the X and Y directions depend on the extent of planeness of the mirrors $R_1$ and $R_2$. The unevennesses in the mirrors can now be detected by means of the $S(\phi_z)$ values of the X and Y interferometer units. To this end, the substrate holder is moved in the X direction, at which $S_x(\phi_z)$ is maintained constant. If the Y measuring mirror $R_2$ has unevennesses, $S_y(\phi_z)$ varies as a function of X. A correction table may be computed from the measured values of $S_y(\phi_z)$ as a function of X, which table can be used during the actual measurement with the Y interferometer unit so as to correct for unevennesses of the mirror $R_2$. For determining unevennesses of the X measuring mirror R, the substrate holder may similarly be moved in the Y direction, at which $S_y(\phi_z)$ is maintained constant. If the X measuring mirror has unevennesses, then $S_x(\phi_z)$ varies as a function of Y. A correction table can also be computed from these variations, which table is used again to correct for unevennesses in the mirror $R_1$ at the actual measurement with the X interferometer unit.

As already noted, when using the interferometer units in a photolithographic apparatus through which the substrates must be fed at a fast rate, strict requirements must be imposed on the delay time elapsing between the instant when a measurement is performed and the instant when the measuring result becomes available. This delay time should be minimal for each measuring axis and, moreover, the differences between the delay times for the different measuring axes should be minimal. If the servoloops, consisting of the measuring systems and the actuators, are closed, the accuracies of the movements in the X and Y directions depend on the speed of the substrate holder and on said time delay differences. If the requirements imposed on the time delay differences are to be alleviated, or if it appears that the desired, even stricter requirements cannot be satisfied in practice, the six-axis interferometer system shown in FIG. 17 may alternatively be used for detecting errors resulting from differences between the time delays in the different measuring axes, and for correcting these differences.

In order to detect the errors, the substrate holder is moved in the X direction, at which $S_x(\phi_z)$ is maintained constant, and possible variations of $S_y(\phi_z)$ are measured as a function of the speed in the X direction, $V_x$. A correction table can be computed from the measured variations, this table being used for the actual measurement. Analogously, the substrate holder may be moved in the Y direction, at which $S_y(\phi_z)$ is maintained constant, and possible variations of $S_x(\phi_z)$ are measured as a function of the speed in the Y direction, $V_y$, and used for composing a correction table for the actual measurement. For a lithographic apparatus, in which scanning takes place in the X direction, particularly the variation $S_y(\phi_z)$ as a function of $V_x$ is important. The measured variations may be used to correct the rotation $\phi_z$ for the speed V used.

When an interferometer system with a sixth measuring axis MAX,6 is used, the information supplied thereby may be used for correcting the position of a holder associated with this interferometer system at every instantaneous position and at every speed of this holder. The holder may not only be a substrate holder but also a mask holder if a six-axis interferometer system is used for controlling the position of the mask holder.

The invention has been described with reference to its use in an apparatus for step-and-scan imaging of a mask pattern on a substrate for manufacturing integrated circuits. However, it may also be used in such an apparatus for manufacturing integrated optical systems, or plenary optical systems, guidance and detection patterns for magnetic domain memories, or liquid crystalline display panels. The apparatus may not only be a photolithographic apparatus, in which the projection beam is a beam of electromagnetic radiation, such as deep UV radiation, and the projection system is an optical projection lens system, but also an apparatus in which the projection radiation is a charged-particle radiation such as electron radiation, ion radiation or X-ray radiation and in which an associated projection system, for example, an electron lens system is used.

We claim:

1. A lithographic projection apparatus for step-and-scan imaging of a mask pattern present in a mask, each time on a different area of a substrate provided with a radiation-sensitive layer, said apparatus, viewed in the direction of a projection beam, successively comprising:

a radiation system supplying a projection beam whose cross-section in the plane of the mask is smaller than the mask pattern;

a mask table being movable in at least a first direction, the scan direction, and provided with a mask holder in which the mask can be fixed;

a projection system constructed and arranged to image the irradiated part of the mask pattern on the substrate with a magnification M;

a substrate table which is movable in the first direction and in a second direction perpendicular thereto and is provided with a substrate holder in which the substrate can be fixed;

a mask table drive unit constructed and arranged to move the mask table during each imaging operation in at least the scan direction with respect to the projection beam and the projection system;

a substrate table drive unit constructed and arranged to move the substrate table during each imaging operation in at least the scan direction at a rate which is equal to M times a rate at which the mask is moved, and a first and a second interferometer system constructed and arranged to measure during each imaging operation, the mutual position of the mask and the substrate, wherein the measuring mirrors of the interferometer systems are constituted by reflecting side faces of the mask holder and the substrate holder, respectively.

2. A lithographic projection apparatus as claimed in claim 1, wherein the second interferometer system is a substrate interferometer system comprising a five-axis system and the first interferometer system is a mask interferometer system comprising at least three measuring axes.

3. A lithographic apparatus as claimed in claim 1, wherein the second interferometer system is a substrate interferometer system comprising a three-axis system, contactless sensors are provided for measuring substrate movements not measured by the three-axis interferometer systems, the substrate holder is provided with measuring faces for the contactless sensors, and the first interferometer system is a mask interferometer system comprising at least three measuring axes.

4. A lithographic projection apparatus as claimed in claim 2, wherein contactless sensors are provided for measuring mask movements not measured by the mask interferometer system, and the mask holder is provided with measuring faces associated with said contactless sensors.

5. A lithographic projection apparatus as claimed in claim 1, wherein the first interferometer system is a mask interferometer system comprising a five-axis system.

6. A lithographic projection apparatus as claimed in claim 1, wherein, with the exception of the measuring mirrors, the components of the interferometer systems are arranged in one rigid frame in which also the projection lens system is rigidly secured, said frame being suspended in a dynamically isolated way from the other components of the apparatus.

7. A lithographic projection apparatus as claimed in claim 1, wherein the second interferometer system is a substrate interferometer system and the chief rays of the measuring beams of the substrate interferometer system are not located in the plane of the substrate, and a substrate measuring signal processing unit is provided for converting all substrate measuring signals into control signals for the X-Y and $\phi_z$ drives for the substrate.

8. A lithographic projection apparatus as claimed in claim 1, wherein a substrate measuring signal processing unit is provided for converting signals reflecting the measured position of the substrate into control signals for the X-Y and $\phi_z$ substrate drives, and into control signals for actuators eliminating tilts of the substrate.

9. A lithographic projection apparatus as claimed in claim 1, wherein at least one of said first and second interferometer systems further comprises a reference axis whose measuring beam cooperates with a stationary reflector.

10. A lithographic projection apparatus as claimed in claim 1, wherein means are provided for supplying a stream of air having a constant refractive index at the area of spaces in which the beams of at least one of the first and second interferometer systems propagate.

11. A lithographic projection apparatus as claimed in claim 1, wherein a retroreflector is arranged in the path of a measuring beam of each measuring axis of at least one of the first and second interferometer systems, which retroreflector passes said measuring beam, after reflection on the associated measuring mirror, back to said mirror for a second reflection on said mirror.

12. A lithographic apparatus as claimed in claim 1, wherein at least one of the interferometer systems comprises a six-axis interferometer system which can be driven in a first, measuring mode and in a second, control mode for controlling the planeness of the measuring mirrors associated with said at least one interferometer system.

13. A lithographic projection apparatus as claimed in claim 1, wherein each of the first and second interferometer systems comprises four or more measuring axes and further comprising a first and a second interferometer unit, the first unit supplying the measuring beams for measuring along three measuring axes, and the second unit supplying the measuring beams for measuring along the other measuring axes.

14. A lithographic apparatus as claimed in claim 12, wherein at least one of the first and second interferometer systems has four or more measuring axes and the two interferometer units have a common radiation source.

15. A lithographic device as claimed in claim 1, wherein a radiation source in each interferometer system is a laser source supplying two beam components having different frequencies and mutually perpendicular directions of polarization.

* * * * *